United States Patent
Montorsi et al.

(10) Patent No.: US 10,868,567 B2
(45) Date of Patent: Dec. 15, 2020

(54) METHODS AND SYSTEMS FOR ENCODING AND DECODING FOR LDPC CODES

(71) Applicant: Huawei Technologies Co., Ltd., Shenzhen, Guangdong (CN)

(72) Inventors: Guido Montorsi, Turin (IT); Sergio Benedetto, Turin (IT); Yan Xin, Kanata (CA); Wei Lin, Shenzhen (CN); Min Yan, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 48 days.

(21) Appl. No.: 16/251,373

(22) Filed: Jan. 18, 2019

(65) Prior Publication Data

US 2019/0222229 A1 Jul. 18, 2019

Related U.S. Application Data

(63) Continuation of application No. PCT/CN2016/090775, filed on Jul. 20, 2016.

(51) Int. Cl.
*H03M 13/11* (2006.01)
*H03M 13/00* (2006.01)

(52) U.S. Cl.
CPC .... *H03M 13/1168* (2013.01); *H03M 13/1185* (2013.01); *H03M 13/635* (2013.01); *H03M 13/6393* (2013.01); *H03M 13/6527* (2013.01)

(58) Field of Classification Search
CPC .......... H03M 13/1168; H03M 13/635; H03M 13/6527; H03M 13/1185; H03M 13/6393;
(Continued)

(56) References Cited

U.S. PATENT DOCUMENTS

2006/0020868 A1* 1/2006 Richardson ........ H03M 13/1137
714/752
2006/0020872 A1* 1/2006 Richardson .......... H03M 13/611
714/758

(Continued)

FOREIGN PATENT DOCUMENTS

| CN | 101128981 A | 2/2008 |
| CN | 101488761 A | 7/2009 |

(Continued)

OTHER PUBLICATIONS

IEEE International Standard: In: "Information technology—Telecommunications and information exchange between Systems—Local and metropolitan area networks—Specific requirements—Part 11: Wireless LAN medium access control (MAC) and physical layer (PHY) specifications—Amendment 3—Enhancements for very high throughput in the 60 GHZ band (adoption of IEEE Std 802.11ad-2012)", Mar. 15, 2014, pp. 452-453. XP055590725.

(Continued)

*Primary Examiner* — Thien Nguyen

(57) ABSTRACT

Methods and devices are disclosed for encoding source words and decoding codewords with LDPC matrices. The Methods and devices use a LDPC matrix $H_n$ of lifting factor Z. The LDPC matrix $H_n$ comprises a plurality of submatrices, each submatrix having a size of Z×Z, and at least one submatrix has $m_1$ diagonals of "1" $m_1$ is an integer>=2.

18 Claims, 31 Drawing Sheets

(58) Field of Classification Search
CPC ........... H03M 13/1177; H03M 13/118; H03M 13/616; H03M 13/6502
See application file for complete search history.

(56) References Cited

U.S. PATENT DOCUMENTS

| | | | |
|---|---|---|---|
| 2006/0036927 A1 | 2/2006 | Kyung et al. | |
| 2007/0113148 A1 | 5/2007 | Hong et al. | |
| 2008/0163027 A1* | 7/2008 | Richardson | H03M 13/611 714/758 |
| 2008/0178065 A1* | 7/2008 | Khandekar | H03M 13/6516 714/801 |
| 2009/0063925 A1* | 3/2009 | Richardson | H03M 13/1137 714/752 |
| 2009/0063933 A1* | 3/2009 | Richardson | H03M 13/1137 714/763 |
| 2009/0164863 A1 | 6/2009 | Oh et al. | |
| 2009/0199068 A1 | 8/2009 | Oh et al. | |
| 2009/0217122 A1 | 8/2009 | Yokokawa et al. | |
| 2009/0249159 A1 | 10/2009 | Lee et al. | |
| 2010/0115371 A1 | 5/2010 | Shen et al. | |
| 2011/0145675 A1 | 6/2011 | Katayama et al. | |
| 2012/0084625 A1* | 4/2012 | Pisek | H03M 13/033 714/757 |
| 2012/0290892 A1 | 11/2012 | Pisek | |
| 2014/0223254 A1 | 8/2014 | Pisek | |
| 2015/0067440 A1 | 3/2015 | Owen et al. | |
| 2016/0094246 A1* | 3/2016 | Vasista Srinivasan Ranganathan | H03M 13/1171 714/776 |

FOREIGN PATENT DOCUMENTS

| | | |
|---|---|---|
| CN | 104779961 A | 7/2015 |
| JP | 2006304132 A | 11/2006 |
| JP | 2011129981 A | 6/2011 |
| KR | 20060064491 A | 6/2006 |
| RU | 2348103 C2 | 2/2009 |
| RU | 2443053 C2 | 2/2012 |
| WO | 2006062351 A1 | 6/2006 |

OTHER PUBLICATIONS

Zongwang Li et al: ""Efficient encoding of quasi-cyclic low-density parity-check codes"" IEEE Transactions on Communications, IEEE Service Center, vol. 54, No. 1, Jan. 1, 2006, pp. 71-81, XP002489550.
IEEE 802.11-16/0233, Additional SC MCSs in clause 20 (DMG PHY Feb. 2, 2016.
IEEE Std 802.11ad™-2012—Section 21.3.8 Common LDPC parity matrices pp. 451-453.
Abu-Surra, Shadi (Samsung), NT-8-Single Carrier PHY, IEEE 802.11-10/0429r1, IEEE, May 2010, total 32 pages.

* cited by examiner

| Short Training Field | CE | Header | BLK | BLK | BLK | BLK | [ AGC subfields | TRN-R/T subfields ] |

FIGURE 4A

| GI 64 | DATA 448 symbols | GI 64 | DATA 448 symbols | GI 64 | DATA 448 symbols | GI 64 |

| 35 | 19 | 41 | 22 | 40 | 41 | 39 | 6  | 28 | 18 | 17 | 3  | 28 |    |    |    |
|----|----|----|----|----|----|----|----|----|----|----|----|----|----|----|----|
| 29 | 30 | 0  | 8  | 33 | 22 | 17 | 4  | 27 | 28 | 20 | 27 | 24 | 23 |    |    |
| 37 | 31 | 18 | 23 | 11 | 21 | 6  | 20 | 32 | 9  | 12 | 29 |    | 0  | 13 |    |
| 25 | 22 | 4  | 34 | 31 | 3  | 14 | 15 | 4  |    | 14 | 18 | 13 | 13 | 22 | 24 |

FIGURE 5D

| 29 | 0  | 8  | 33 | 22 | 17 | 4  | 27 | 28 | 20 | 27 | 24 | 23 |    |    |
|----|----|----|----|----|----|----|----|----|----|----|----|----|----|----|
| 37 | 31 | 18 | 23 | 11 | 21 | 6  | 20 | 32 | 9  | 12 | 29 | 10 | 0  | 13 |
| 25 | 22 | 4  | 34 | 31 | 3  | 14 | 15 | 4  | 2  | 14 | 18 | 13 | 13 | 22 | 24 |

$$P_0 = \begin{bmatrix} 1 & 0 & 0 & 0 \\ 0 & 1 & 0 & 0 \\ 0 & 0 & 1 & 0 \\ 0 & 0 & 0 & 1 \end{bmatrix}, P_1 = \begin{bmatrix} 0 & 1 & 0 & 0 \\ 0 & 0 & 1 & 0 \\ 0 & 0 & 0 & 1 \\ 1 & 0 & 0 & 0 \end{bmatrix}, P_3 = \begin{bmatrix} 0 & 0 & 0 & 1 \\ 1 & 0 & 0 & 0 \\ 0 & 1 & 0 & 0 \\ 0 & 0 & 1 & 0 \end{bmatrix}$$

FIGURE 5E

| 37+29 | 31+30 | 18+0 | 22+9 | 11+33 | 21+22 | 6+17 | 20+4 | 32+27 | 9+28 | 12+20 | 29+27 | 10+24 | 0+23 | 13+ | +  |
|-------|-------|------|------|-------|-------|------|------|-------|------|-------|-------|-------|------|-----|----|
| 25    | 22    | 4    | 31   | 31    | 3     | 14   | 15   | 4     | 2    | 14    | 18    | 13    | 13   | 22  | 24 |

FIGURE 9A

| 37    | 31    | 18   | 23   | 11    | 21    | 6     | 20    | 32    | 9     | 12    | 29    | 10    | 0     | 13   | -    |
|-------|-------|------|------|-------|-------|-------|-------|-------|-------|-------|-------|-------|-------|------|------|
| 25+29 | 22+30 | 4+0  | 34+8 | 31+33 | 3+22  | 14+17 | 15+4  | 4+27  | 2+28  | 14+20 | 18+27 | 13+24 | 13+23 | 22+- | 24+- |

FIGURE 9B

| 37+29 | 31+30 | 18+0 | 23+8 | 11+33 | 21+22 | 6+17 | 20+4 | 32+27 | 9+28 | 12+20 | 29+27 | -+24 | 0+23 | 13+- | -+ |
|---|---|---|---|---|---|---|---|---|---|---|---|---|---|---|---|
| 25+35 | 22+19 | 4+41 | 34+22 | 31+40 | 3+41 | 14+39 | 15+6 | 4+28 | -+18 | 14+17 | 18+3 | 13+28 | 13+- | 22+- | 24+- |

METHODS AND SYSTEMS FOR ENCODING AND DECODING FOR LDPC CODES

RELATED APPLICATIONS

The present application is a continuation of, and claims the benefit of and priority to, International Application No. PCT/CN2016/090775 entitled "METHODS AND SYSTEMS FOR ENCODING AND DECODING FOR LDPC CODES" filed Jul. 20, 2016, the contents of which are incorporated herein by reference.

TECHNICAL FIELD

The present application relates to mobile air interface technologies, in particular to methods and systems for encoding and decoding for binary low density parity check (LDPC) codes.

BACKGROUND

An LDPC encoder at a transmitter is used for encoding source words to generate codewords. An LDPC decoder at a receiver is used for decoding the received codewords. LDPC codes of various rates have been adopted in the IEEE 802.11ad standard.

Several rate 7/8 LDPC codes have been proposed in IEEE 802.11REVmc. However, the proposed LDPC codes either have not been optimized in terms of error rate performance or have a different codeword length from that of the LDPC codes in the IEEE 802.11ad standard. The differences in codeword length may impact the implementation of the blocking and de-blocking processes at the transmitter and at the receiver respectively.

SUMMARY

According to one embodiment of the present disclosure, there is provided a method for encoding a source word. The method comprises receiving a 1×K source word row vector $\bar{u}$; and generating a 1×N codeword vector $\bar{c}=\bar{u}\cdot G$, wherein G is a K×N generator matrix, and wherein G is derived from a parity check matrix $H_n$, and $H_n$ having a lifting factor Z, and wherein the $H_n$ comprises a plurality of submatrices, each submatrix having a size Z×Z, and wherein at least one submatrix has $m_1$ diagonals of "1", and wherein $m_1$. is an integer>=2.

According to one embodiment of the present disclosure, $G=[I_k P^T]$, where $P_{(n-k)\times k}$ is a binary matrix and $I_{(n-k)}$ is the identify matrix of order n−k, where "T" denotes the matrix transpose; and wherein a parity check matrix $Hn=[P_{(n-k)\times k} I_{(n-k)}]$.

According to one embodiment of the present disclosure, $H_n$ is generated by partitioning a first M×N parity check matrix H, with a lifting factor of Z, wherein M=I×Z, N=J×Z, and wherein I and J are integers, I>2 and J>0, into square submatrices, wherein the partitioned parity check matrix H contains submatrices of (M/Z) rows×(N/Z) columns; selecting $m_1$ rows from the M/Z rows of submatrices of the partitioned parity check matrix H; and adding the $m_1$ rows of the submatrices of the first partitioned parity check matrix H as a row of submatrices of the matrix $H_n$, and $m_1$ is a integer>=2. In one embodiment, M−($m_1$×Z)+Z=N−K. In one embodiment, Z=42, N=672. In another embodiment, K=588, and the new matrix $H_n$, comprises 84 rows×672 columns.

According to one embodiment of the present disclosure, the remaining $m_2$ rows of the submatrices of the partitioned parity check matrix H are added as a second new row of submatrices of the new matrix $H_n$, and $m_2$ is an integer>=1. In one embodiment, $m_2 =<((M/Z)-m1)$, According to one embodiment of the present disclosure, the method further includes adding $m_2$ rows from remaining (M/Z−$m_1$) rows of the submatrices of the first partitioned parity check matrix H as a second submatrix row of the new matrix $H_n$; adding $m_3$ rows from remaining (M/Z−$m_1$−$m_2$) rows of the submatrices of the first partitioned parity check matrix H as a third submatrix row of the new matrix $H_n$; and adding $m_4$ rows from remaining (M/Z−$m_1$−$m_2$−$m_3$) rows of the submatrices of the first partitioned parity check matrix H as a fourth submatrix row of the new matrix $H_n$, wherein N=1344, Z=42, $m_1$, $m_2$, $m_3$, and $m_4$ are integers, $m_1+m_2+m_3+m_4=<M/Z$, $m_1>1$ $m_2>=1$, $m_3>=1$, and $m_4>=1$.

According to one embodiment of the present disclosure, the first parity check matrix H is a code rate 13/16 LDPC matrix specified in 802.11 ad, wherein the first matrix H=126 rows×672 columns, and Z=42, and wherein the second matrix $H_n$ is generated with parameters $m_1$=2, Z=42.

According to one embodiment of the present disclosure, the first parity check matrix H is a code rate 13/16 low density parity check (LDPC) matrix, wherein the first matrix H=252 rows×1344 columns, and Z=84, and wherein the second matrix $H_n$ is generated with parameters m1=2, Z=84.

According to one embodiment of the present disclosure, the second matrix $H_n$ is

| 37 + 29 | 31 + 30 | 18 + 0 | 23 + 8 | 11 + 33 | 21 + 22 | 6 + 17 | 20 + 4 | 32 + 27 | 9 + 28 | 12 + 20 | 29 + 27 | 10 + 24 | 0 + 23 | 13 + — | — + — |
|---|---|---|---|---|---|---|---|---|---|---|---|---|---|---|---|
| 25 | 22 | 4 | 34 | 31 | 3 | 14 | 15 | 4 | 2 | 14 | 18 | 13 | 13 | 22 | 24 |

According to one embodiment of the present disclosure, the second matrix $H_n$ is

| 37 | 31 | 18 | 23 | 11 | 21 | 6 | 20 | 32 | 9 | 12 | 29 | 10 | 0 | 13 | — |
|---|---|---|---|---|---|---|---|---|---|---|---|---|---|---|---|
| 25 + 29 | 22 + 30 | 4 + 0 | 34 + 8 | 31 + 33 | 3 + 22 | 14 + 17 | 15 + 4 | 4 + 27 | 2 + 28 | 14 + 20 | 18 + 27 | 13 + 24 | 13 + 23 | 22 + — | 24 + — |

According to one embodiment of the present disclosure, the first parity check matrix H is a code rate 3/4 LDPC matrix specified in 802.11 ad, wherein the first matrix H=168 rows×672 columns, and Z=42, and wherein the second matrix Hn is generated with parameters $m_1=2$ and $m_2=2$, Z=42.

According to one embodiment of the present disclosure, the first parity check matrix H is a code rate 3/4 LDPC matrix, wherein the first matrix H=336 rows×1344 columns, and Z=84, and wherein the second matrix $H_n$ is generated with parameters $m_1=2$ and $m_2=2$, Z=84.

According to one embodiment of the present disclosure, the second matrix $H_n$ is

| | | | | | | | | | | | | | 13 + | — + |
|---|---|---|---|---|---|---|---|---|---|---|---|---|---|---|
| 37 + 35 | 31 + 19 | 18 + 41 | 23 + 22 | 11 + 40 | 21 + 41 | 6 + 39 | 20 + 6 | 32 + 28 | 9 + 18 | 12 + 17 | 29 + 3 | — + 28 | 0 + — | — — |
| 25 + 29 | 22 + 30 | 4 + 0 | 34 + 8 | 31 + 33 | 3 + 22 | 14 + 17 | 15 + 4 | 4 + 27 | — + 28 | 14 + 20 | 18 + 27 | 13 + 24 | 13 + 23 | 22 + 24 + |

According to one embodiment of the present disclosure, the second matrix Hn is

| | | | | | | | | | | | | | | — + |
|---|---|---|---|---|---|---|---|---|---|---|---|---|---|---|
| 37 + 29 | 31 + 30 | 18 + 0 | 23 + 8 | 11 + 33 | 21 + 22 | 6 + 17 | 20 + 4 | 32 + 27 | 9 + 28 | 12 + 20 | 29 + 27 | — + 24 | 0 + 23 | 13 + — — |
| 25 + 35 | 22 + 19 | 4 + 41 | 34 + 22 | 31 + 40 | 3 + 41 | 14 + 39 | 15 + 6 | 4 + 28 | — + 18 | 14 + 17 | 18 + 3 | 13 + 28 | 13 + — | 22 + — 24 + |

According to one embodiment of the present disclosure, $H_n=[H_1 H_2]$, and wherein $H_1=(n-k)\times(k)$ matrix with a lifting factor Z, wherein H1 comprises a plurality of submatrices, each submatrix having a size of Z×Z, and wherein $H_2$ is a full-rank (n−k)×(n−k) matrix whose columns are weigh 2 except for the last column.

According to one embodiment of the present disclosure, H1 is

| | | | | | | | | | | |
|---|---|---|---|---|---|---|---|---|---|---|
| 9 + 24 + 31 | 31 | 32 + 36 | 16 + 41 | 3 + 21 | 12 + 28 | 12 | | 17 + 22 | 24 |
| 41 | 1 + 3 + 37 | 12 + 39 | 32 + 36 | 2 + 30 | 10 | 4 + 9 + 20 | | | | and H2 is $$H_2 = \begin{bmatrix} 1 & & & & \\ 1 & 1 & & & \\ & & \cdots & & \\ & & & 1 & 1 \\ & & & & 1 & 1 \end{bmatrix}.$$

According to one embodiment of the present disclosure, there is provided a method for decoding a demodulated signal. The method comprises: receiving the demodulated signal, the signal having a row vector S; and decoding the 1×N row vector S with a parity check matrix $H_n$ that is used in an encoding process; and generating a 1×N vector $c=[c_1, \ldots, c_n]$ to recover a 1×K source word row vector $\bar{u}$, wherein $Hnc^T=0$, and wherein the $H_n$ comprises a plurality of submatrices, $H_n$ having a lifting factor Z, each submatrix having a size of Z×Z, and wherein at least one submatrix has $m_1$ diagonals, and wherein $m_1$ is an integer>=2.

According to one embodiment of the present disclosure, there is provided a system for performing the methods described above.

According to one embodiment of the present disclosure, there is provided a system for implementing the methods described above. In one embodiment, the system is a station. In one embodiment, the system is an access point. In one embodiment, the system is a wireless transceiver unit.

BRIEF DESCRIPTION OF THE DRAWINGS

Reference will now be made, by way of example, to the accompanying figures which show example embodiments of the present application, and in which:

FIG. 4A is a diagram illustrating an example single carrier frame format of 802.11ad;

FIG. 4B is a diagram illustrating an example structure of data blocks of the single carrier frame format of 802.11ad;

FIGS. 5A-5D are LDPC parity check matrices specified in IEEE802.11ad with codeword length of 672, and FIG. 5E illustrates cyclic-permutation submatrices obtained from a 4×4 identity matrix;

FIGS. 9A and 9B are diagrams illustrating example LDPC parity check matrices $H_n$ of code rate 7/8 based on rate 13/16 LDPC in 802.11 according to the present disclosure;

FIGS. 10A and 10B are diagrams illustrating example LDPC parity check matrices $H_n$ of code rate 7/8 based on rate 3/4 LDPC in 802.11 according to the present disclosure;

FIG. 11 is a diagram illustrating an example submatrix of a LDPC parity check matrix $H_n$ according to the present disclosure;

Like reference numerals are used throughout the Figures to denote similar elements and features. While aspects of the invention will be described in conjunction with the illustrated embodiments, it will be understood that it is not intended to limit the invention to such embodiments.

DETAILED DESCRIPTION OF EXAMPLE EMBODIMENTS

The present disclosure teaches methods, devices, and systems for encoding source words and decoding codewords in a wireless network. While described below primarily with respect to 802.11ad networks, the present disclosure may also be applied to other blocking coding based systems.

Figure 1A:
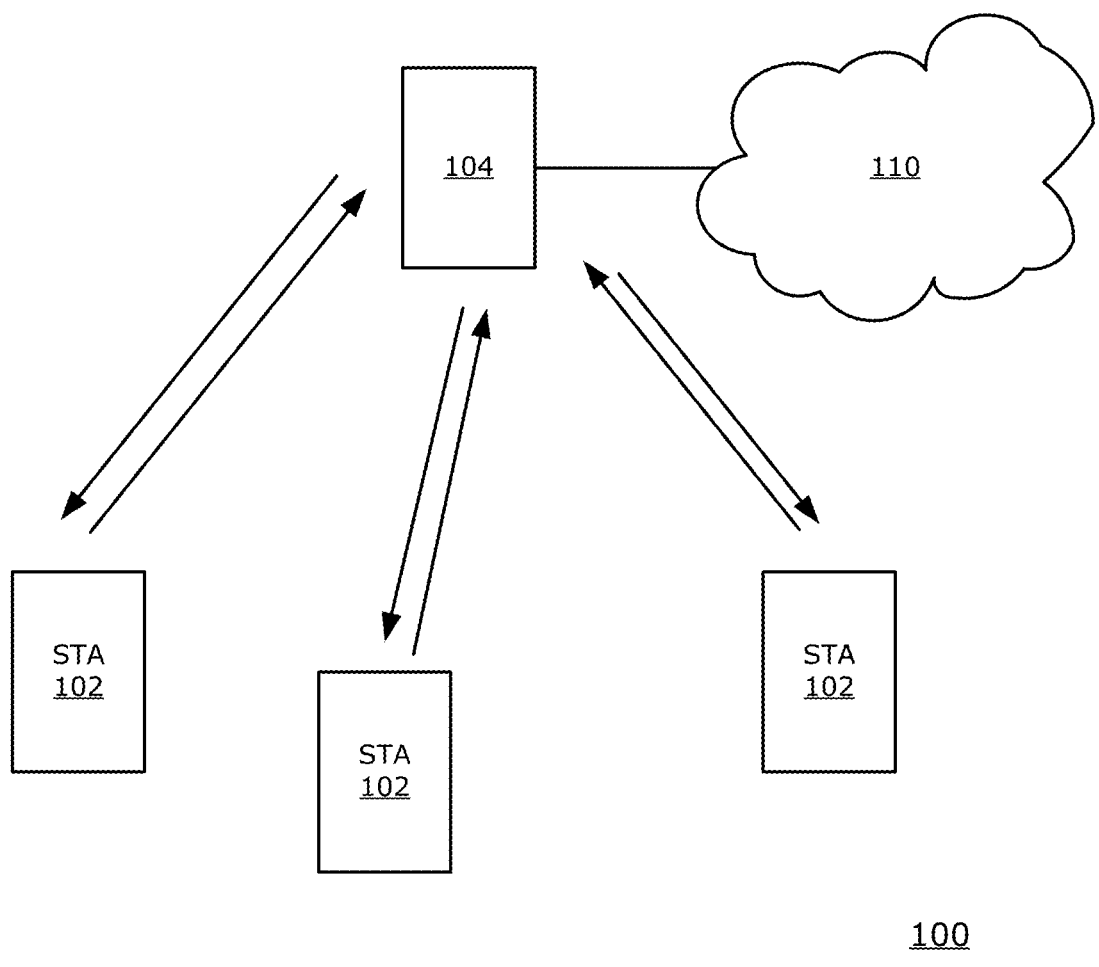
FIG. 1A is a block diagram illustrating an example communications system in accordance with one implementation of the present disclosure.

FIG. 1A illustrates a communications network 100 comprising a plurality of stations (STAs) 102 and an access point (AP) 104. Each of the STA 102 and AP 104 may include a transmitter, a receiver, an encoder, and/or a decoder as described herein. The network 100 may operate according to one or more communications or data standards or technologies including but not limited to IEEE 802.11 networks, fifth generation (5G) or fourth generation (4G) telecommunications networks, Long-Term Evolution (LTE), 3rd Generation Partnership Project (3GPP), Universal Mobile Telecommunications System (UMTS) and other wireless or mobile communications networks. The STA 102 generally can be any device capable of providing wireless communications or using the 802.11 protocol. The STA 102 may be a laptop, a desktop PC, PDA, access point or Wi-Fi phone, wireless transmit/receive unit (WTRU), mobile station (MS), mobile terminal, smartphone, cellular telephone, or other wireless enabled computing or mobile device. In some embodiments, the STA 102 comprises a machine which has the capability to send, receive, or send and receive data in the communications network 100 but which performs primary functions other than communications. In one embodiment, a machine includes an apparatus or device with means to transmit and/or receive data through the communications network 100 but such apparatus or device is not typically operated by a user for the primary purpose of communications. The AP 104 may comprise a base station (BS), evolved Node B (eNB), wireless router, or other network interface, which functions as a wireless transmission and/or reception point for STA 102 in the network 100. The AP 104 is connected to a backhaul network 110 which enables data to be exchanged between the AP 104 and other remote networks, nodes, APs, and devices (not shown). The AP 104 may support communications with each STA 102 by establishing uplink and downlink communications channels with each STA 102, as represented by the arrows in FIG. 1A. Communications in the network 100 may be unscheduled, scheduled by the AP 104 or by a scheduling or management entity (not shown) in the network 100, or a mix of scheduled and unscheduled communications.

Figure 1B:
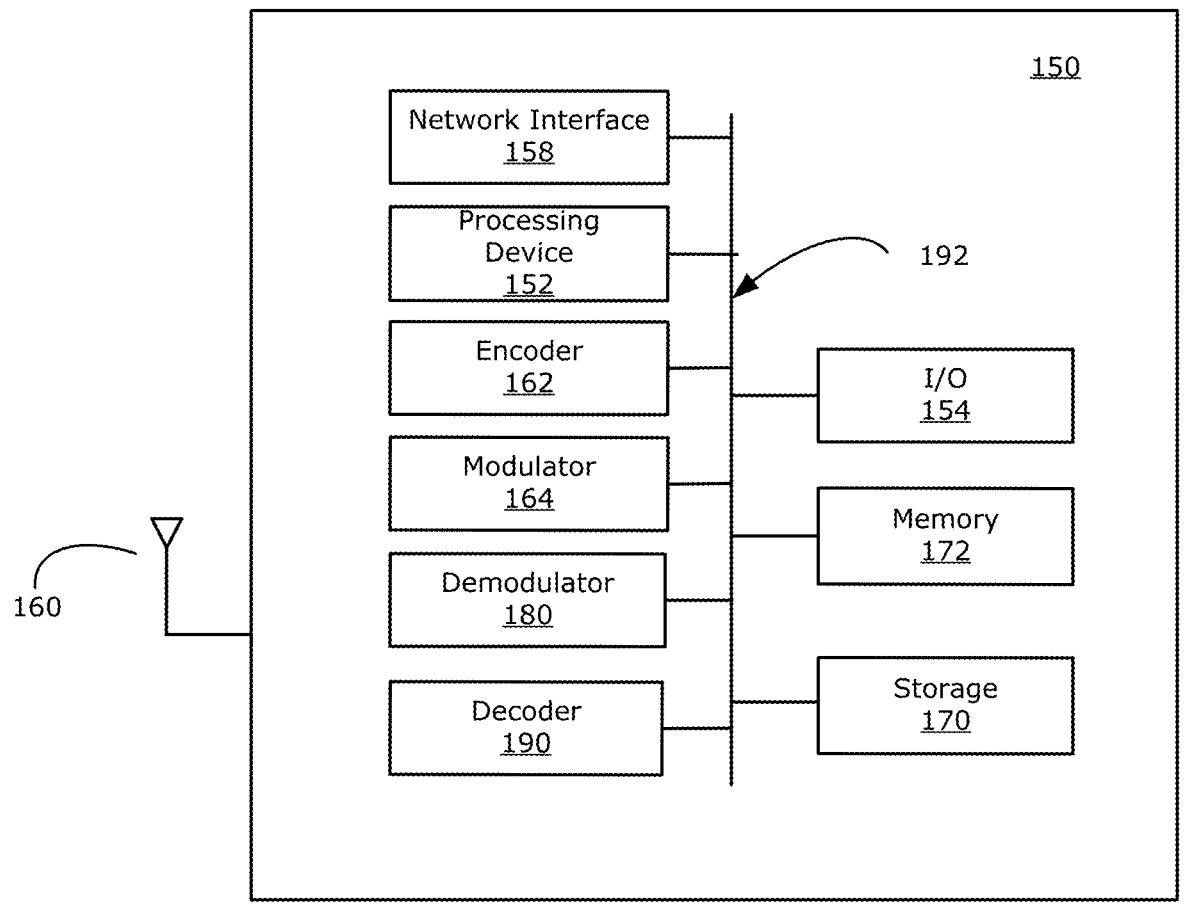
FIG. 1B is a block diagram illustrating an example processing system in accordance with one implementation of the present disclosure.

FIG. 1B illustrates an example processing system 150, which may be used to implement methods and systems described herein, such as the STA 102 or the AP 104. The processing system 150 may be a base station, a wireless router, a mobile device, for example, or any suitable processing system. Other processing systems suitable for implementing the present disclosure may be used, which may include components different from those discussed below. Although FIG. 1B shows a single instance of each component, there may be multiple instances of each component in the processing system 150.

The processing system 150 may include one or more processing devices 152, such as a processor, a microprocessor, an application-specific integrated circuit (ASIC), a field-programmable gate array (FPGA), a dedicated logic circuitry, or combinations thereof. The processing system 150 may also include one or more input/output (I/O) interfaces 154, which may enable interfacing with one or more appropriate input devices and/or output devices (not shown). One or more of the input devices and/or output devices may be included as a component of the processing system 150 or may be external to the processing system 150. The processing system 150 may include one or more network interfaces 158 for wired or wireless communication with a network, such as but not limited to, an intranet, the Internet, a P2P network, a WAN, LAN, a WLAN and/or a cellular or mobile communications network such as a 5G, 4G, LTE or other network as noted above. The network interface(s) 208 may include wired links (e.g., Ethernet cable) and/or wireless links (e.g., one or more radio frequency links) for intra-network and/or inter-network communications. The network interface(s) 158 may provide wireless communication via one or more transmitters or transmitting antennas, one or more receivers or receiving antennas, and various signal processing hardware and software, for example. In this example, a single antenna 160 is shown, which may serve as both transmitting and receiving antenna. However, in other examples there may be separate antennas for transmitting and receiving. The network interface(s) 158 may be configured for sending and receiving data to the backhaul network 110 or to other user devices, access points, reception points, transmission points, network nodes, gateways or relays (not shown) in the network 100.

The processing system 150 may also include one or more storage units 170, which may include a mass storage unit such as a solid state drive, a hard disk drive, a magnetic disk drive and/or an optical disk drive. The processing system 150 may include one or more memories 172, which may include a volatile or non-volatile memory (e.g., a flash memory, a random access memory (RAM), and/or a read-only memory (ROM)). The non-transitory memory(ies) 172 may store instructions for execution by the processing device(s) 152, such as to carry out the present disclosure. The memory(ies) 172 may include other software instructions, such as for implementing an operating system and other applications/functions. In some examples, one or more data sets and/or module(s) may be provided by an external memory (e.g., an external drive in wired or wireless communication with the processing system 150) or may be provided by a transitory or non-transitory computer-readable medium. Examples of non-transitory computer readable media include a RAM, a ROM, an erasable programmable ROM (EPROM), an electrically erasable programmable ROM (EEPROM), a flash memory, a CD-ROM, or other portable memory storage.

The processing system 150 may include an encoder 162 for encoding source words to codewords and/or a modulator 164 for modulating codewords to symbols. The encoder 162 may perform encoding on source words to generate codewords in bits. The modulator 164 may then perform modulation on the codewords (e.g., by modulation techniques such as BPSK, QPSK, 16QAM, or 64QAM). In some examples, instructions coded in the memory 172 may configure processing device 152 to perform the functions of the encoder 162 and/or the modulator 164, such that the encoder 162 and/or the modulator 164 may not be distinct modules of the processing system 150. In some examples, the encoder 162 and the modulator 164 may be embodied within a transmitter module in the processing system 150. In some examples, the transmitting antenna 160, the encoder 162, and the modulator 164 may be embodied as a transmitter component external to the processing system 150, and may simply communicate the source words from the processing system 150.

The processing system 150 may include a demodulator 180 and a decoder 190, for processing a received signal. The demodulator 180 may perform demodulation on a received modulated signal (e.g., a BPSK, QPSK, 16QAM, or 64QAM signal). The decoder 190 may then perform appropriate decoding on the demodulated signal, in order to recover the original signal contained in the received signal. In some examples, instructions coded in the memory 172 may configure processing device 152 to perform the functions of the demodulator 180 and/or the decoder 190, such that the demodulator 180 and/or the decoder 190 may not be distinct modules of the processing system 150. In some examples, the demodulator 180 and the decoder 190 may be embodied within a receiver module in the processing system 150. In some examples, the receiving antenna 160, demodulator 180 and decoder 190 may be embodied as a receiver component external to the processing system 150, and may simply communicate the signal decoded from the received signal to the processing system 150.

There may be a bus 192 providing communication among components of the processing system 150, including the processing device(s) 152, I/O interface(s) 154, network interface(s) 158, encoder 162, modulator 164, storage unit(s) 170, memory(ies) 172, demodulator 180 and decoder 190. The bus 192 may be any suitable bus architecture including, for example, a memory bus, a peripheral bus or a video bus.

Communications between the STA 102 and the AP 104 in the network 100 may be implemented by encoding source words to be transmitted using low density parity check (LDPC) encoding techniques, and/or by decoding codewords received using LDPC code decoding techniques. After source words are encoded with LDPC encoding techniques, when the encoded codewords are transmitted in a signal from the AP 104 to the STA 102 or from the STA 102 to the AP 104, the LDPC encoding information of the transmitted signal may be included in the frame transmitted. After the transmitted signal is received by the STA 102 or the AP 104, with the LDPC encoding information of the received signal, the STA 102 or the AP 104 may then select appropriate LDPC decoding technologies to decode the received signal.

Transmitter and Encoder

Figure 2A:
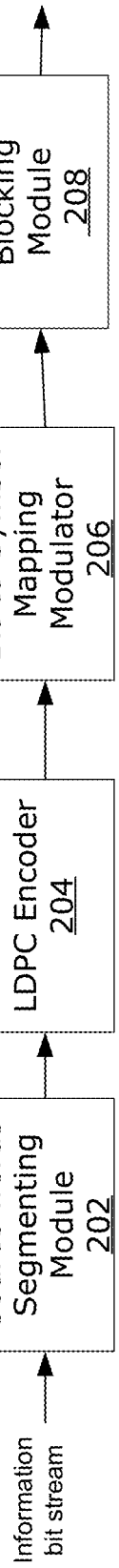
FIG. 2A is a block diagram representing an example implementation of a transmitter of the present disclosure.

FIG. 2A represents an example implementation of a transmitter of the STA 102 or the AP 104. The transmitter may include a source words segmenting module 202, a LDPC encoder 204, a bit-to-symbol mapping modulator 206, and a blocking module 208.

Figure 2B:
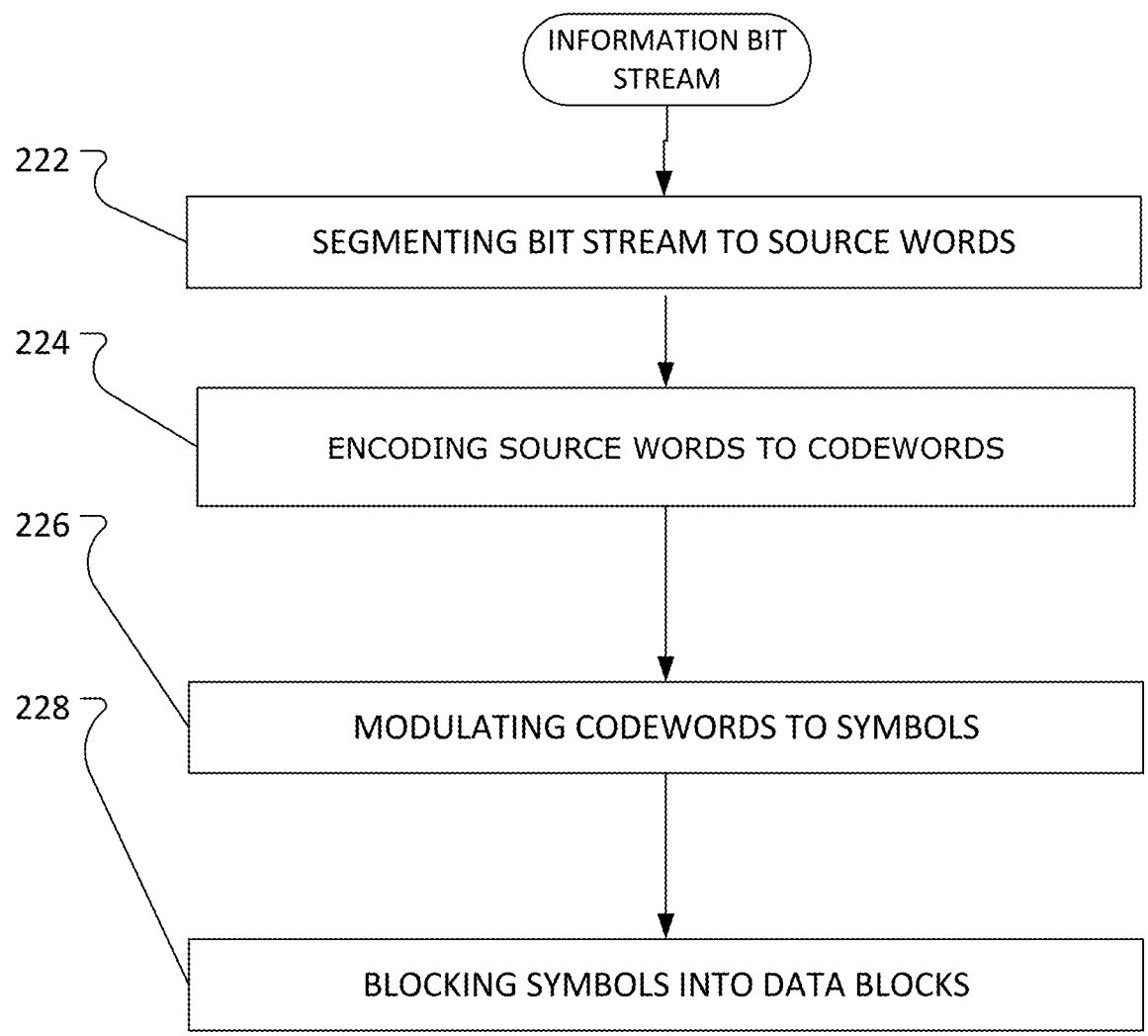
FIG. 2B is a block diagram illustrating example steps in a method of processing information bit stream of the present disclosure.

FIG. 2B illustrates example steps of processing input information bit stream by the transmitter.

The source words segmenting module 202 may be used to segment the input information bit streams into source words with appropriate sizes (step 222). For example, with the source words segmenting module 202, the input information bit streams may be segmented into source words with sizes of 336 bits (for 1/2 code rate in 802.11ad), 420 bits (for 5/8 code rate in 802.11ad), 504 bits (for 3/4 code rate in 802.11ad), 546 bits (for 13/16 code rate in 802.11ad), and 588 bits (for 7/8 code rate with codeword size of 672 bits). A source word of K bits may be considered as a 1×K row vector or a one-dimensional binary 1×K matrix. For example, a 588 bits source word may be considered as a 1×588 rows vector or a one-dimensional binary 1×588 matrix.

Figure 3:
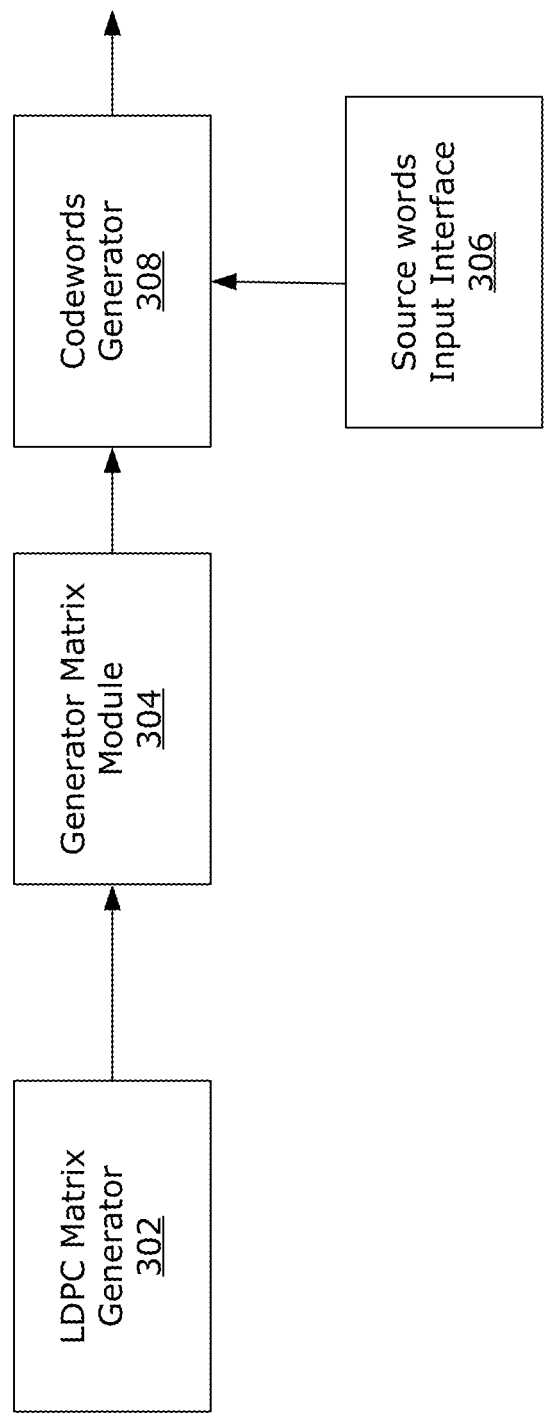
FIG. 3 is a block diagram representing an example implementation of an LDCP encoder of the present disclosure.

The source words then may be encoded to codewords with the LDPC encoder 204 (step 224). FIG. 3 represents an example implementation of the LDPC encoder 204. In an embodiment, the LDPC encoder 204 may include a LDPC matrix generator 302, a generator matrix module 304, a source word input interface 306, and a codewords generator 308.

The LDPC parity check matrix generator 302 may generate a LDPC parity check matrix H, which is a binary (N−K)×N matrix, for example N=672, K=588. LDPC codes functionally are defined by a sparse parity-check matrix. An (n, k) LDPC code is a linear binary block code C with a k-dimensional subspace of $\{0, 1\}^n$. Using Gaussian elimination and reordering of columns can result in an equivalent parity-check matrix in systematic form $H=[P_{(n-k)\times k} I_{(n-k)}]$, where $P_{(n-k)\times k}$ is a binary matrix and $I_{(n-k)}$ is the identify matrix of order n−k.

Based on LDPC parity check matrix generated by the LDPC matrix generator 302, the generator matrix module 304 may generate a generator matrix G. The generator matrix G in systematic form which is correspondent to H can be $G=[I_k P^T]$, where "T" denotes the matrix transpose. The generator matrix G is a binary K×N matrix. The row space of G is orthogonal to H such that $GH^T=0$. Therefore, in LDPC encoding, once H has been designed, G can also be determined accordingly. As well, the matrix H satisfies $H\bar{c}^T=0$, where $\bar{c}=[c_1, \ldots, c_n]$ is codeword of N bits. The generator matrix module 304 then forwards the generated binary (K×N) generator matrix G to the codewords generator 308.

The source word input interface 306 receives the source words from the source words segmenting module 202. As discussed previously, the received source word may be considered as a row vector $\bar{u}[u_1, \ldots, u_K]$. The source word input interface 306 is then forward the received source words to the codewords generator 308. With the source word $\bar{u}=[u_1, \ldots, u_k]$ and the binary (K×N) generator matrix G, by multiplying the source word with the generator matrix G, $\bar{u} \cdot G = \bar{c}$, the codewords generator 308 generates codewords of N bits $\bar{c} = [c_1, \ldots, c_N]$.

In one embodiment, the generator matrix G may be pre-stored in the LDPC encoder 204. After the source words $\bar{u} = [u_1, \ldots, u_K]$ have been received by the codewords generator 308, the codewords generator 308 may generate codewords $\bar{u} \cdot G = \bar{c}$, $\bar{c} = [c_1, \ldots, c_N]$, without generating the LDPC matrix H or the generator matrix G.

Referring to FIG. 2, the encoded codewords $\bar{c}$ then may be modulated to symbols at bit-to-symbol mapping modulator 206 (step 226). Suitable modulation techniques may be, but is not limited to, BPSK, QPSK, 16QAM, or 64QAM. BPSK, QPSK and 16QAM modulations are specified in 802.11ad. 64QAM modulation is adopted in 802.11REVmc. In BPSK modulation, binary bits are simply mapped to be bipolar {−1, 1} symbols. In QPSK, 16QAM and 64QAM modulations, the input encoded bit streams (codewords $\bar{c}$ in bits) are grouped into sets of 2, 4 and 6 bits, respectively. Each set of bits is mapped to a symbol on the corresponding constellations. For example, for BPSK, QPSK, 16QAM, and 64QAM, a symbol represents 1 bit, 2 bits, 4 bits, and 6 bits, respectively. A plurality of the symbols may be grouped as a modulated codewords. For example, the modulated codewords may include 336 symbols (for SC QPSK blocking in 802.11 ad), 168 symbols (for SC 16QAM blocking in 802.11ad), 112 symbols (for SC 64QAM blocking in 802.11ad).

The modulated codewords may be further assembled into data blocks (BLKs) with appropriate size in the blocking module 208 (step 228). In an embodiment, the assembled data blocks may contain 448 symbols as specified in the 802.11ad standard.

The transmitter in FIG. 2 therefore may be used to generate the data blocks required in the 802.11ad standard.

FIG. 4A illustrates an example single carrier (SC) frame structure of 802.11ad standard. The frame includes short training field (STF), channel estimation (CE) field, PHY Header, SC data blocks (BLKs) and optional automatic gain control (AGC) and TRN-R/T subfields for beam forming training. A SC frame of 802.11ad standard may include a plurality BLKs, as shown in FIGS. 4A and 4B.

FIG. 4B illustrates an example construction of SC data blocks (BLKs) according to the 802.11ad standard. In FIG. 4B, each BLK consists of 448 symbols. A 64 bits guard interval (GI) is used between every two adjacent BLKs to separate adjacent data blocks.

LDPC Codes with Codeword Length 672 in 802.11ad

As LDPC encoded codewords are generated through operations of source words and the generator matrix G, and as the generator matrix G is derived from LDPC parity check matrix H, an LDPC parity check matrix H effects encoding source words to codewords. The design of the LDPC parity check matrix H may improve the performance of the code. The parity-check matrice H may be further partitioned into square submatrices of size Z×Z. Z is a lifting factor. The submatrices are either cyclic-permutations of the identity matrix, or null submatrices with all zero entries.

A location with index i denotes the cyclic-permutation submatrix Pi obtained from the Z×Z identity matrix $P_0$ by cyclically shifting the columns to the right by i elements.

FIGS. 5A-5D illustrate the parity check matrices of four LDPC codes specified in 802.11ad with the rates of 1/2, 5/8, 3/4, and 13/16. In 802.11ad, each LDPC code has a common codeword length of 672 bits. The code rate K/N denotes that a K bits source word is encoded to an N bits codeword. With respect to the 802.11ad standard, the codeword length N is 672 bits. Therefore, for the code rates of 1/2, 5/8, 3/4, and 13/16, the sizes of the corresponding source word are 336 bits, 420 bits, 504 bits, and 546 bits, respectively.

FIG. 5E illustrates an example of the cyclic permutation submatrices $P_1$ and $P_3$ obtained from the Z×Z identity matrix $P_0$. In FIG. 5E, Z=4. $P_1$ is obtained by shifting the columns of $P_0$ to the right by one element, and $P_3$ obtained is obtained by shifting the columns of $P_0$ to the right by three elements.

Figures 5A, 5B:
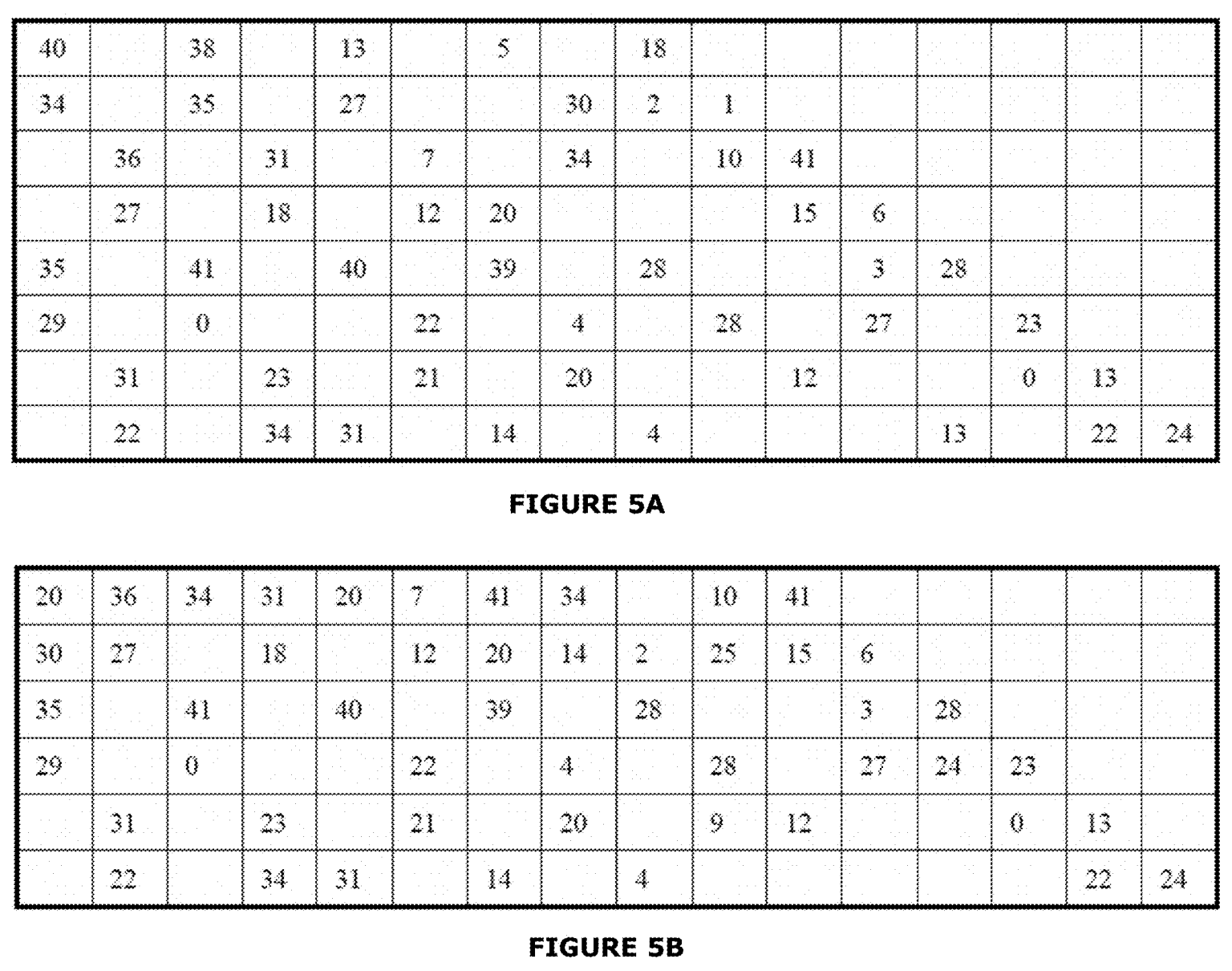

In FIG. 5A, submatrix with the value "0" represents $P_0$, which is a 42×42 identity submatrix, and the first submatrix with the value "40" in FIG. 5A is obtained by shifting the columns of $P_0$ to the right by 40 elements. Similarly, any non-zero value i submatrices $P_i$ in FIGS. 5B-5D can also be obtained from the respective identity matrix $P_0$.

FIG. 5A shows a code rate 1/2 LDPC parity check matrix H=336 rows×672 columns, with Z=42. FIG. 5B shows a code rate 5/8 LDPC parity check matrix H=252 rows×672 columns, with Z=42. FIG. 5C shows a code rate 3/4 LDPC parity check matrix H=168 rows×672 columns, with Z=42. FIG. 5D shows a code rate 13/16 LDPC parity check matrix H=126 rows×672 columns, with Z=42. In FIGS. 5A-5D, the blank entries represent Z×Z submatrices with all zero entries.

LDPC Codes with Codeword Length 1344 in 802.11ay

FIGS. 6A-6D illustrate four LDPC codes proposed in 802.11ay with the rates of 13/16, 3/4, 5/8 and 1/2. The code rate K/N denotes that a K bits source word is encoded to an N bits codeword. With respect to the 802.11ay standard, the codeword length N is 1344 bits. Therefore, for the code rates of 13/16, 3/4, 5/8 and 1/2, the sizes of the corresponding source word are 1092, 1008, 840 and 672 bits, respectively.

Figure 6A:
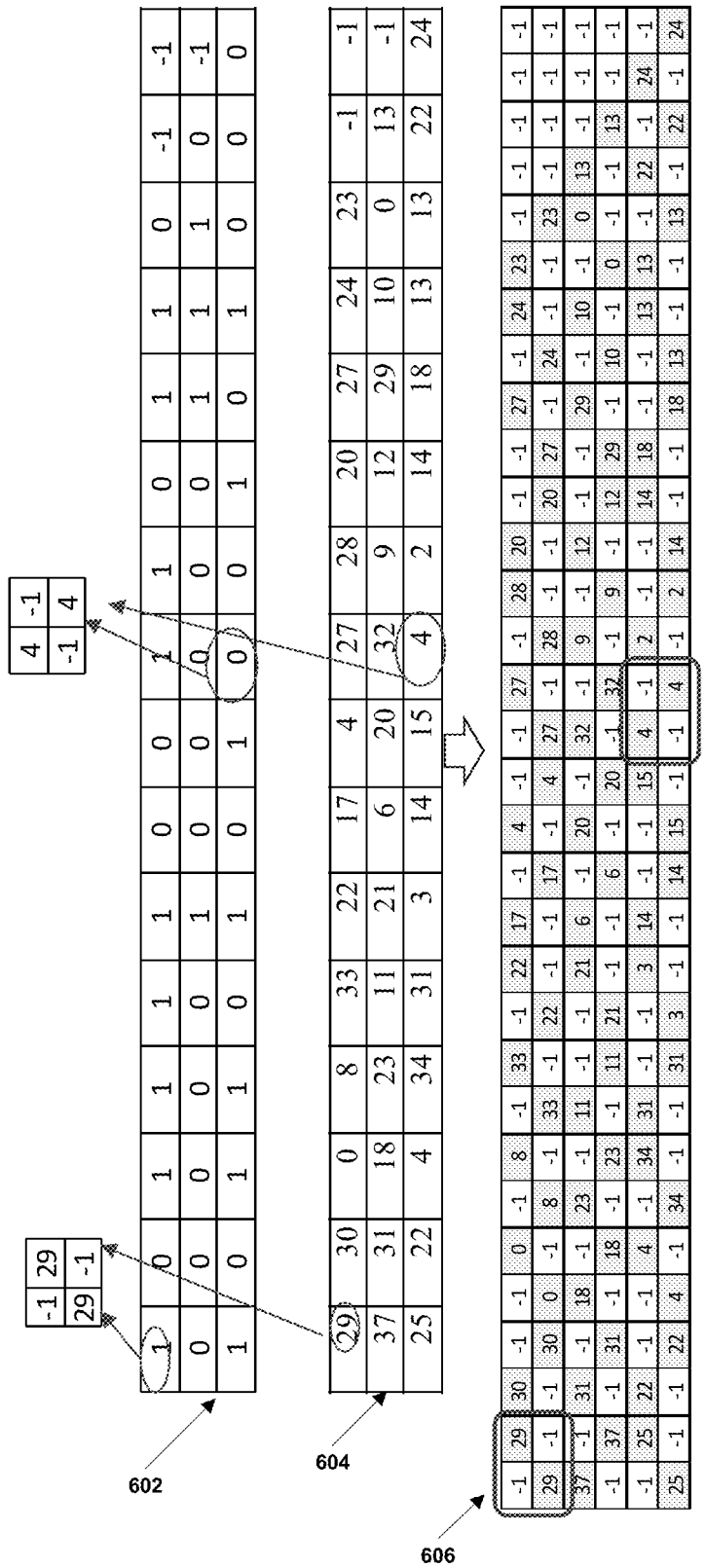
FIGS. 6A-6D are LPDC parity check matrices proposed in IEEE802.11ay with codeword length of 1344.

The LDPC codes illustrated in FIGS. 6A-6D are generated by two-step lifting. In the example of FIG. 6A, the rate 13/16 LDPC code 606 with codeword length of 1344 is generated from a lifting matrix 602 and the rate 13/16 base matrix 604 of 802.11ad with the lifting factor Z=42, as shown in FIG. 5D. In other words, the base matrix 604 has 126 rows×672 columns, Z=42, or 3 rows×16 columns of submatrices.

As shown in FIG. 6A, the lifting matrix 602 has the same rows and columns of submatrices as the rate 13/16 base matrix 604 of 802.11ad.

The lifting matrix 602 is proposed in the IEEE 802.11ay standardization to provide a second lifting. Each entry in the lifting matrix 602 has one of the three possible values "1", "0", and "−1". If a submatrix of the base matrix 604 is null, which is denoted as "−1", the corresponding entry in the lifting matrix 602 is also denoted as "−1". For example, the entry at row 1, column 16 of the lifting matrix 602 corresponds to the submatrix at row 1, column 16 of the base matrix 604. Both the entry of the lifting matrix 602 and the submatrix of the base matrix 604 have the value of "−1".

To generate the 13/16 LDPC code 606 with codeword length of 1344, the lifting matrix 602 is applied to the 13/16 LDPC base matrix 604 with codeword length of 672. In particular, for a submatrix having a value "V" of the base matrix 604, if the entry of the corresponding lifting matrix 602 has a value of "1", applying the lift matrix 602 to the base matrix 604 generates 4 submatrices as follows:

| −1 | V  |
|----|----|
| V  | −1 |

For a submatrix having a value "V" of the base matrix 604, if the entry of the corresponding lifting matrix 602 has a value of "0", applying the lift matrix 602 to the base matrix 604 generates 4 submatrices of as follows:

| V | −1 |
|---|---|
| −1 | V |

In FIG. 6A, in the example of the submatrix at row 1, column 1 of the base matrix 604, which has the value of "29", as the corresponding entry at row 1, column 1 of the lifting matrix 602 has a value of "1", applying the entry of the lifting matrix 602 with the corresponding submatrix of the base matrix 604 generates 4 submatrices as follows

| −1 | 29 |
|---|---|
| 29 | −1 |

As well, in the example of the submatrix at row 3, column 9 of the base matrix 604, which has the value of "4", as the corresponding entry at row 3, column 9 of the lifting matrix 602 has a value of "0", applying the entry of the lifting matrix 602 with the corresponding submatrix of the base matrix 604 generates 4 submatrices as follows:

| 4 | −1 |
|---|---|
| −1 | 4 |

For the submatrices with the value of "−1" in the base matrix 604, the corresponding entries of the lifting matrix 602 also have the value of "−1". Applying the one entry with the value of "−1" in the lifting matrix 602 to the corresponding submatrix in the base matrix 604 generates four null submatrices.

Figure 6B:
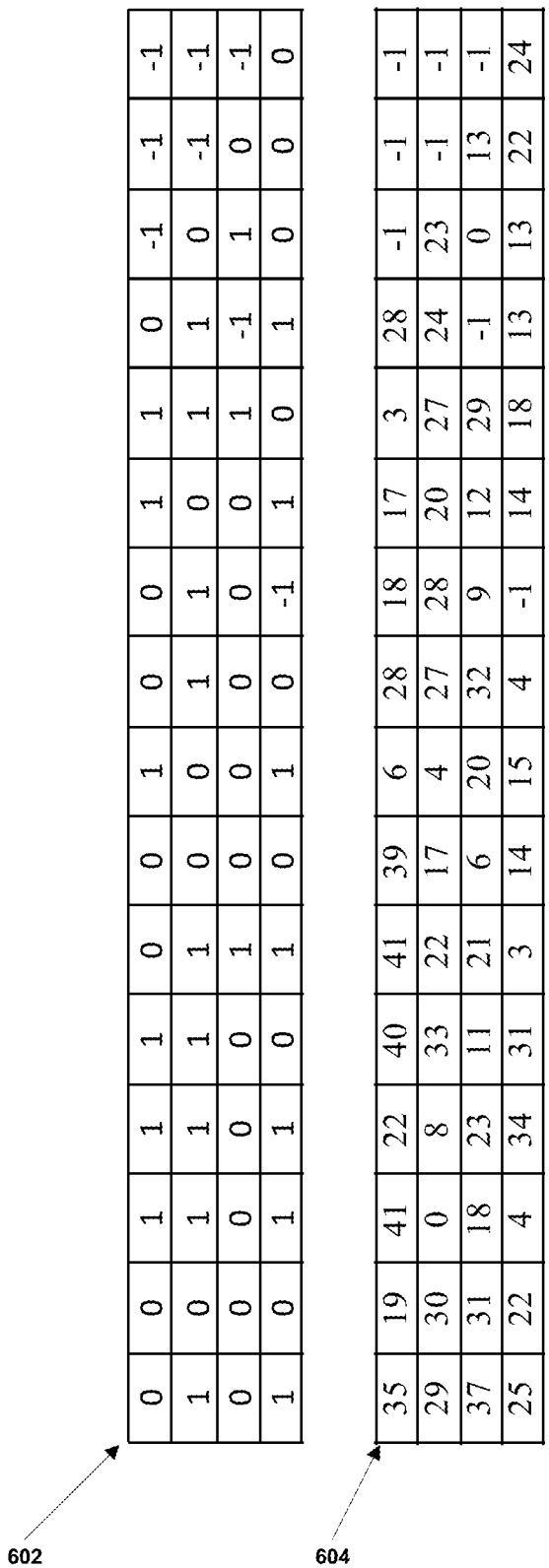
Figure 6C:
Figure 6D:
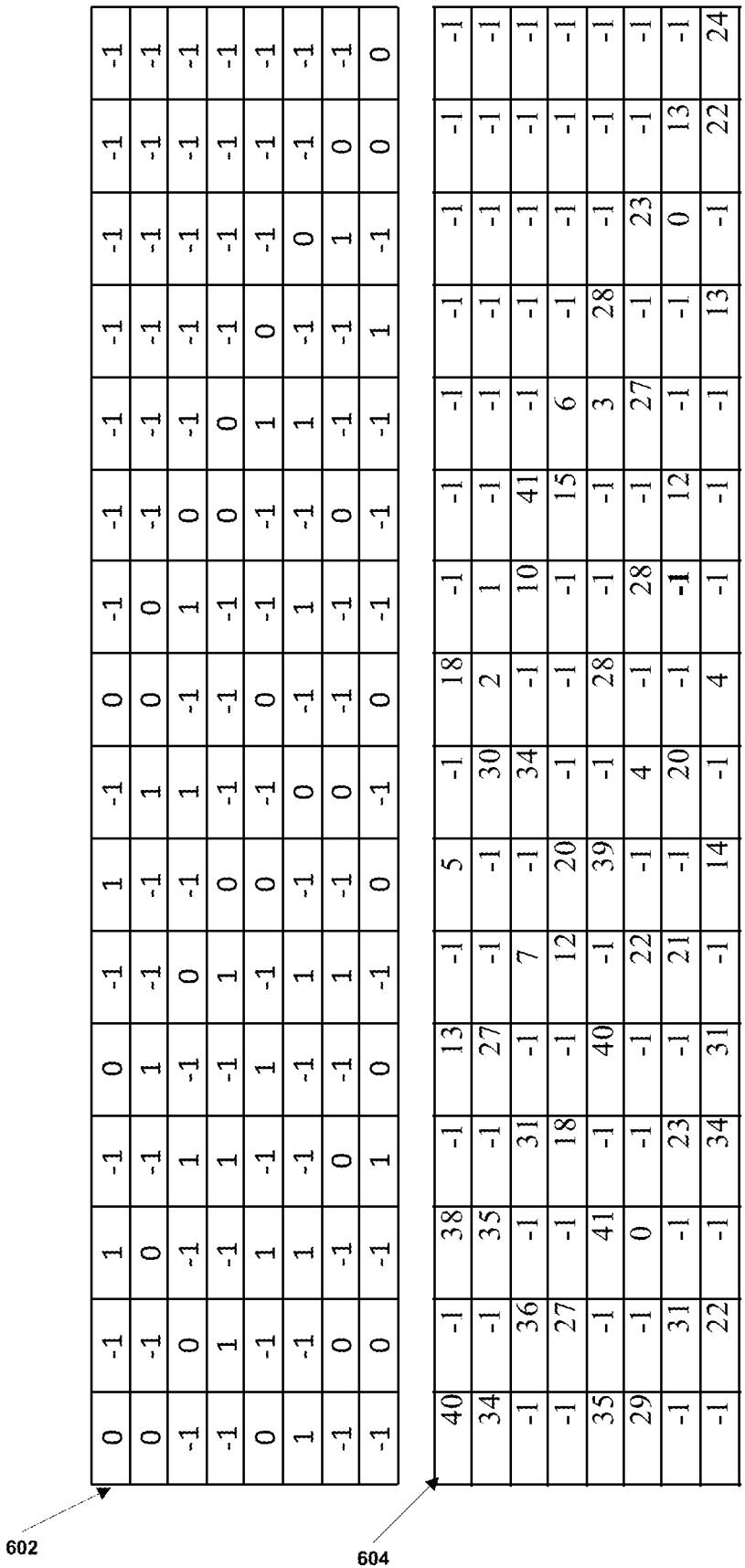

Similarly, with the same rules described above with respect to the rate 13/16 LDPC code with codeword length of 1344, applying corresponding lifting matrices 602, as shown in FIGS. 6B-6D, to rates 3/4, 5/8 and 1/2 base matrices 604 with the codeword length of 672 of 802.11ad generates rates 3/4, 5/8 and 1/2 LDPC code with codeword length of 1344.

As well, the LDPC codes with codeword length of 1344 may also be generated by increasing the lifting factor Z. In particular, to construct codes with submatrix size 672×2=1344, the structure of the base matrix and the column position shifts remain the same, but the lifting factor is increased from Z=42 to Z=84. For example, a 3/4 base matrix with the codeword length of 672 of 802.11ad contains 168 rows×672 columns, Z=42, as shown in FIG. 5C. In other words, the 3/4 base matrix contains 4 rows×16 columns of submatrices, and each submatrices has a size of Z×Z (42×42). When the lifting factor Z increases from 42 to 84, the 3/4 base matrix containing 4 rows×16 columns of submatrices will become 336 rows×1344 columns.

Proposed Codes 802.11ad standard does not specify LDPC codes with code rate of 7/8. A rate 7/8 LDPC code with codeword length of 624 is introduced in 802.11 REVmc. The rate 7/8 LDPC code of 802.11 REVmc is generated by puncturing the first 48 parity bits from rate 13/16 codewords based on the existing rate 13/16 LDPC code specified in 802.11ad. In implementation, a transmitter does not transmit the punctured bits, and the receiver puts equal likelihood for 1/0 for the punctured bits. The sizes of a source word and a codeword of the rate 7/8 code are 546 bits and 624 bits, respectively.

A rate 7/8 LDPC code with codeword length of 1248 is introduced in 802.11 ay. The rate 7/8 LDPC code of 802.11ay is generated by puncturing the first 96 parity bits from rate 13/16 LDPC code with codeword length of 1344. In implementation, a transmitter does not transmit the punctured bits, and the receiver puts equal likelihood for 1/0 for the punctured bits. The sizes of a source word and a codeword of the rate 7/8 code are 1092 bits and 1248 bits, respectively.

Because the 7/8 LDPC codes introduced in 802.11 REVmc and 802.11ay have not been optimized, their performance may require further improvement.

In addition, as the sizes of the LDPC codewords have been changed from the standard 672 bits in 802.11ad to 624 bits in 802.11 REVmc, and from 1344 bits for rates 1/2, 5/8, 3/4 and 13/16 to 1248 bits for rate 7/8 in 802.11ay. However, as the modulated codewords are still to be assembled into data blocks with a block size of 448 symbols in 802.11ad, or 896 symbols in 802.11ay, the blocking process that assembles the modulated codewords into data blocks has to be changed accordingly. These changes in assembling data blocks require additional processes to implement encoding and decoding for the 7/8 LDPC code introduced in 802.11 REVmc or the LDPC code proposed to 802.11ay.

Figure 7A:
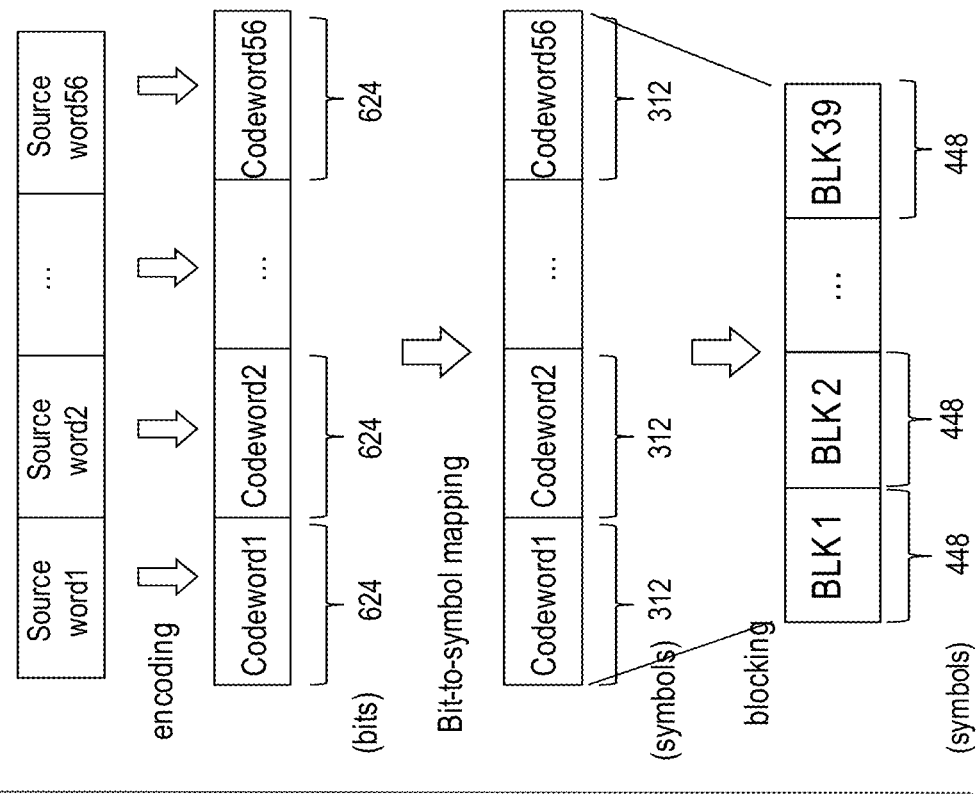
FIGS. 7A-7C are diagrams showing single carrier blockings with different modulation techniques in 802.11ad and in 802.11REVmc.
Figure 7A:
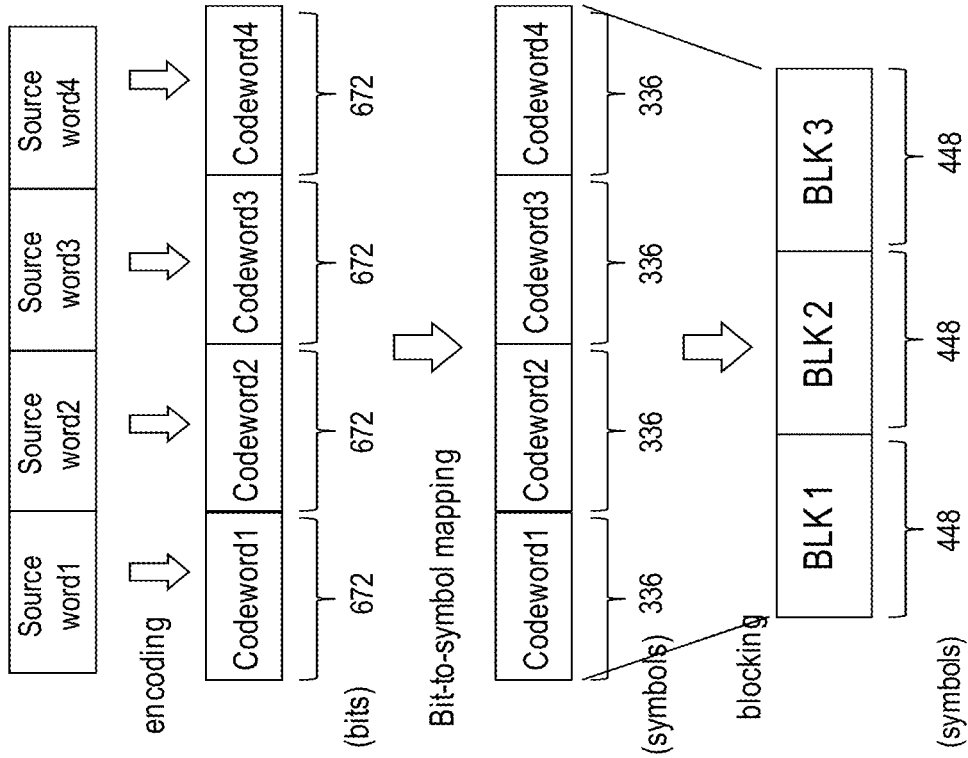

For example, FIG. 7A shows examples of SC QPSK blocking in 802.11ad and 802.11REVmc. In 802.11ad, with QPSK, one 672 bits codeword after modulation becomes one 336 symbols codeword. Every three SC data blocks are constructed from four 336 symbols codewords, and each 448 symbols data block is constructed from two 336 symbols codewords, namely, 448=336+112 or 448=224+224. However, in 802.11REVmc, as the first 48 parity bits have been punctured from the rate 13/16 LDPC code, each of the encoded codeword contains 624 bits, and with QPSK, one 624 bits codeword after modulation becomes one 312 symbols codeword. As a result, the blocking process becomes more complex: every 39 data blocks are constructed from 56 codewords, and each data block is constructed from two or three codewords, for example, 448=312+136, or 448=176+272, or 448=40+312+96, or 448=216+232, etc.

Figure 7B:
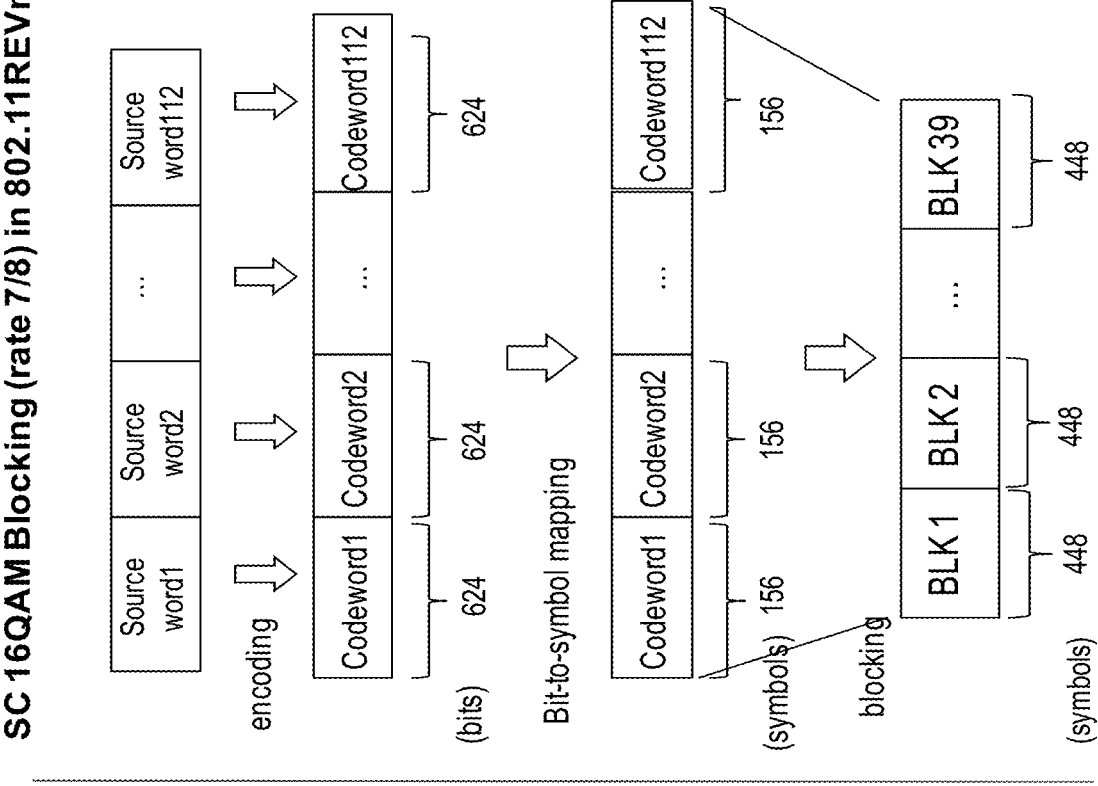
Figure 7B:
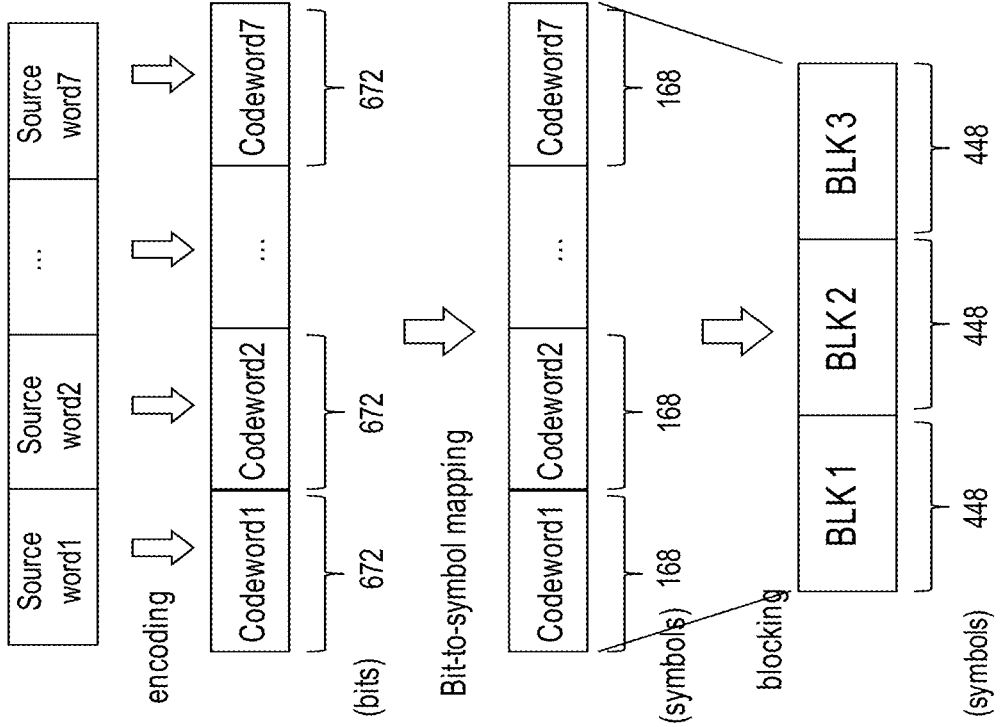

FIG. 7B shows examples of SC 16QAM blocking in 802.11ad and 802.11REVmc. In 802.11ad, with 16QAM, one 672 bits codeword after modulation becomes one 168 symbols codeword. Every three SC data blocks are constructed from seven 168 symbols codewords, and each 448 symbols data block is constructed from three or four 168 symbols codewords, namely, 448=168+168+112 or 448=56+168+168+56. However, in 802.11REVmc, as each of the encoded codeword contains 624 bits, and with 16QAM, one 624 bits codeword after modulation becomes one 156 symbols codeword. As a result, the blocking process becomes more complex: every 39 data blocks are constructed from 112 codewords, and each data block is constructed from three or four codewords, for example, 448=156+156+136, 448=20+156+156+116, etc.

Figure 7C:
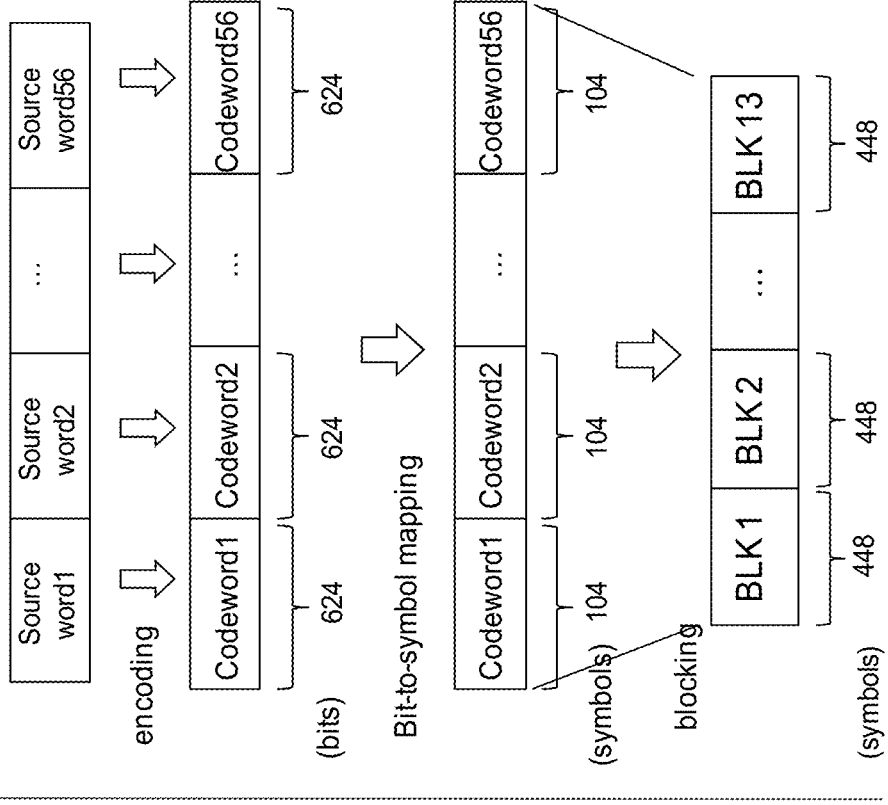
Figure 7C:
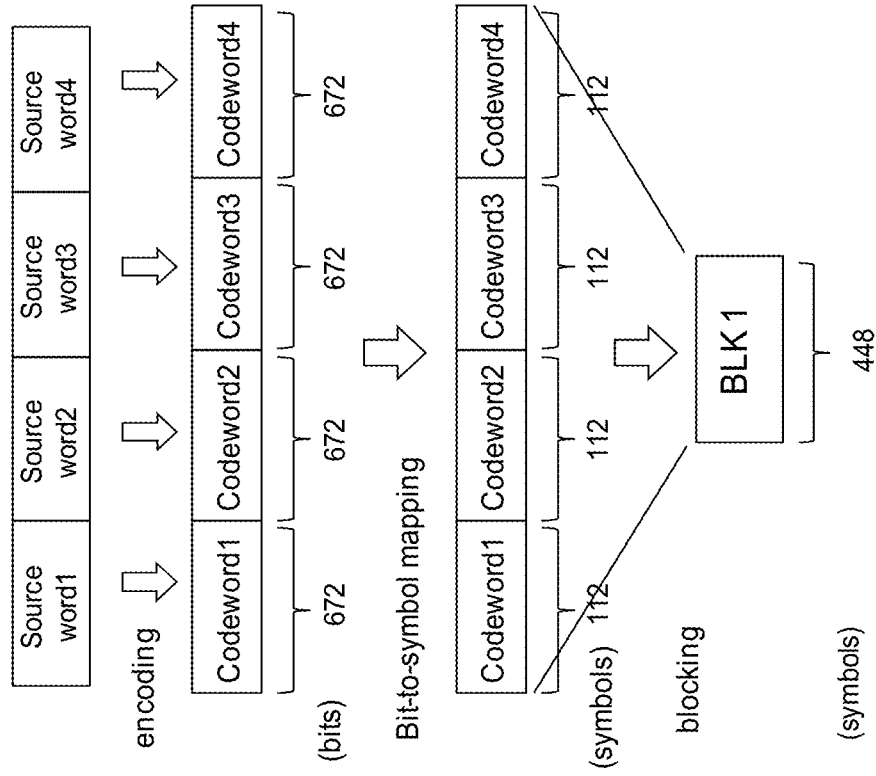

Similarly, FIG. 7C shows examples of SC 64QAM blocking in 802.11ad and 802.11REVmc. In 802.11ad, with 64QAM, one 672 bits codeword after modulation becomes one 112 symbols codeword. Each 448 symbols data block is constructed from four 112 symbols codewords, namely, 448=112+112+112+112. However, in 802.11REVmc, one 624 bits codeword after modulation becomes one 104 symbols codeword. As a result, the blocking process becomes more complex: every 13 data blocks are constructed from 56 codewords, and each data block is constructed from five or six codewords.

As well, because the rate 7/8 LDPC code introduced in 802.11 REVmc has a different codeword length (624 bits) from the 672 bits LDPC codewords specified in 802.11ad, this difference makes it more complex in encoding the source words in a transmitter and in decoding of the codewords in a receiver.

New Codes

In one embodiment of the present disclosure, a 1×K source word row vector $\bar{u}$ may be encoded, at the LDPC encoder 204, to a 1×N codeword vector $\bar{c}=\bar{u}\cdot G$ is a K×N generator matrix. G may be derived from a (N−K)×N parity check matrix Hn=[$P_{(n-k)\times k} I_{(n-k)}$] with a lifting factor Z. $P_{(n-k)\times k}$ is a binary matrix and $I_{(n-k)}$ is the identify matrix of order N−K. $H_n$ comprises a plurality of submatrices, and each submatrix has a size of Z×Z. At least one submatrix in $H_n$ comprises $m_1$ diagonals of "1", and $m_1$ is an integer>=2.

G may then be derived from H, namely, $G=[I_k P^T]$. "T" denotes the matrix $P_{(n-k)\times k}$ transpose.

Figure 8:
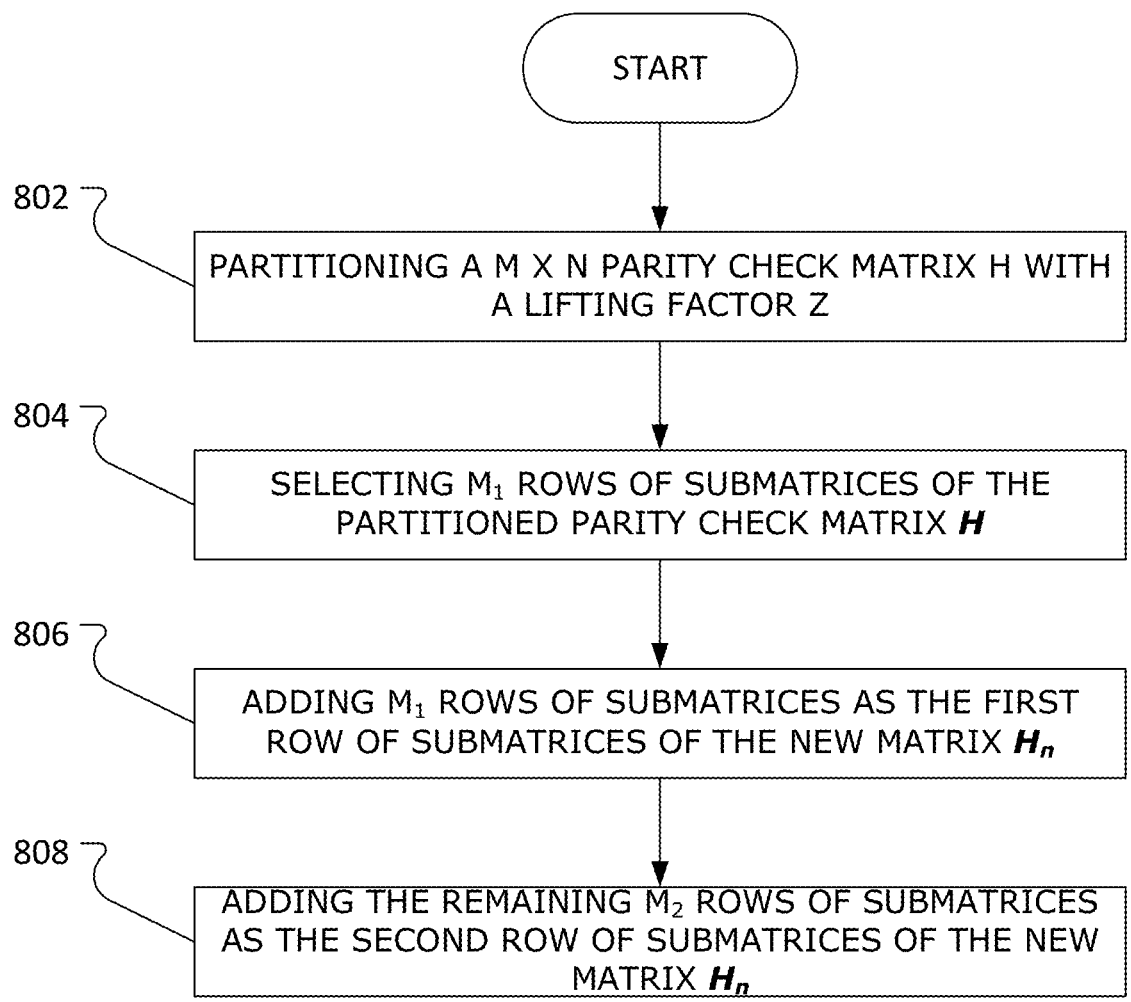
FIG. 8 is a block diagram illustrating example steps in a process of generating a parity check matrix $H_n$ for LDPC encoding according to one embodiment of the present disclosure.

In one embodiment of the present disclosure, a K/N rate LPDC parity check matrix $H_n$ may be generated, at the LDPC matrix generator 302, from a M×N parity check matrix H, with a lifting factor of Z, where M=I×Z, N=J×Z, I and J are integers>=2. As shown in FIG. 8, the M×N parity check matrix H may be further partitioned into square submatrices of size Z×Z (step 802). The partitioned parity check matrix H contains submatrices of (M/Z) rows×(N/Z) columns. In other words, the partitioned parity check matrix H contains M/Z check nodes and N/Z variable nodes. The K/N rate LPDC code may be obtained by generating a new parity check matrix $H_n$, with the lifting factor Z, from the partitioned parity check matrix H. In particular, the LDPC matrix generator 302 may select $m_1$ rows from the M/Z rows of submatrices of the partitioned parity check matrix H (step 804), where $m_1>=2$, and add $m_1$ rows of the submatrices of the partitioned parity check matrix H as one new row of submatrices of the new matrix $H_n$ (step 806). Each of the remaining rows ((M/Z)−$m_1$) of submatrices of the partitioned parity check matrix H becomes one row of the new matrix $H_n$. In this case, the new parity check matrix $H_n$ contains submatrices of ((M/Z)−$m_1$+1) rows×(N/Z) columns. In other words, the new parity check matrix $H_n$ contains (((M/Z)−$m_1$+1)×Z)=N−K.

In one embodiment, the LDPC matrix generator 302 may add $m_2$ rows from the remaining rows ((M/Z)−$m_1$) submatrices of the partitioned parity check matrix H as a second new row of submatrices of the new matrix $H_n$ (step 808), where $m_1$ and $m_2$ are integers, $m_1+m_2$=<M/Z, $m_1$>1 and $m_2$>=1. In one embodiment, $m_2+m_2$=M/Z, and therefore, in this embodiment, the new matrix $H_n$ contains submatrices of 2 rows×(N/Z) columns.

In one embodiment, N=672, Z=42, an LDPC parity check matrix $H_n$ may be generated, from a LDPC parity check matrix H of M rows×672 columns, Z=42. The M×672 parity check matrix H may be further partitioned into square matrices of size 42×42. The partitioned parity check matrix H contains submatrices of (M/42) rows×(672/42) columns. In other words, the partitioned parity check matrix H contains M check nodes and 672 variable nodes. In one embodiment, a 7/8 rate LPDC code may be obtained based on a new matrix $H_n$, with Z=42, from the partitioned parity check matrix H. In particular, the LDPC matrix generator 302 adds $m_1$ rows of the submatrices of the partitioned parity check matrix H as the first submatrix row of the new matrix $H_n$. In one embodiment, the LDPC matrix generator 302 adds up $m_2$ rows from the remaining rows ((M/Z)−$m_1$) of the submatrices of the partitioned parity check matrix H as a second row of submatrix of the new matrix $H_n$, where $m_2$>=1, and $m_2+m_2$=<M/42 In one embodiment, $m_2+m_2$=M/42, and therefore, in this embodiment, the new matrix $H_n$ contains submatrices of 2 rows×(672/42) columns.

In one embodiment, N=1344, Z=84. an LDPC parity check matrix $H_n$ may be generated, based on an LDPC parity check matrix H of M rows×1344 columns, Z=84. The M×1344 parity check matrix H may be further partitioned into square matrices of size 84×84. The partitioned parity check matrix H contains submatrices of (M/84) rows×(1344/84) columns. In other words, the partitioned parity check matrix H contains M check nodes and 1344 variable nodes. In one embodiment, a 7/8 rate LPDC code may be obtained based on a new matrix $H_n$, with Z=84, from the partitioned parity check matrix H. In particular, first, the LDPC matrix generator 302 adds $m_1$ rows of the submatrices of the partitioned parity check matrix H as the first submatrix row of the new matrix $H_n$. Second, the LDPC matrix generator 302 adds $m_2$ rows of the submatrices of the partitioned parity check matrix H as the second submatrix row of the new matrix $H_n$. $M_1$ and $m_2$ are integers, $m_1+m_2$=<M/84, $m_1$>1 and $m_2$>=1. In one embodiment, $m_1+m_2$=M/84, and therefore, in this embodiment, the new matrix $H_n$ contains submatrices 2 rows×16 columns, with Z=84.

In one embodiment, N=1344, Z=42, an LDPC parity check matrix $H_n$ may be generated, based on an LDPC parity check matrix H of M rows×1344 columns, Z=42. The M×1344 parity check matrix H may be further partitioned into square matrices of size 42×42. The partitioned parity check matrix H contains submatrices of (M/42) rows×(1344/42) columns. In other words, the partitioned parity check matrix H contains M check nodes and 1344 variable nodes. In one embodiment, a 7/8 rate LPDC code may be obtained based on a new matrix $H_n$, with Z=42, from the partitioned parity check matrix H. In particular, first, the LDPC matrix generator 302 adds $m_1$ rows of the submatrices of the partitioned parity check matrix H as the first submatrix row of the new matrix $H_n$. Second, the LDPC matrix generator 302 adds $m_2$ rows of the submatrices of the partitioned parity check matrix H as the second submatrix row of the new matrix $H_n$. Third, the LDPC matrix generator 302 adds $m_3$ rows of the submatrices of the partitioned parity check matrix H as the third submatrix row of the new matrix $H_n$. Finally, the LDPC matrix generator 302 adds up $m_4$ rows from the remaining rows of the submatrices of the partitioned parity check matrix H as the fourth row of submatrix of the new matrix $H_n$. $m_1$, $m_2$, $m_3$, and $m_4$ are integers, $m_1+m_2+m_3+m_4$=<M/42, $m_1$>1 $m_2$>=1, $m_3$>=1, and $m_4$>=1. In one embodiment, $m_1+m_2+m_3+m_4$=M/42, and therefore, the new matrix $H_n$ contains submatrices 4 rows×32 columns.

In one embodiment, in an LDPC parity check matrix H, M=126, N=672, Z=42 and the new matrix $H_n$ contains 84 rows×672 columns.

In one embodiment, in an LDPC parity check matrix H, M=168, N=672, Z=42 and the new matrix $H_n$ contains 84 rows×672 columns.

In one embodiment, in an LDPC parity check matrix H, M=252, N=672, Z=42 and the new matrix $H_n$ contains 84 rows×672 columns.

In one embodiment, in an LDPC parity check matrix H, M=336, N=672, Z=42 and the new matrix $H_n$ contains 84 rows×672 columns.

In one embodiment, in an LDPC parity check matrix H, M=252, N=1344, Z=42, and the new matrix $H_n$ contains 168 rows×1344 columns.

In one embodiment, in an LDPC parity check matrix H, M=336, N=1344, Z=42, and the new matrix $H_n$ contains 168 rows×1344 columns.

In one embodiment, in an LDPC parity check matrix H, M=504, N=1344, Z=42 and the new matrix $H_n$ contains 168 rows×1344 columns.

In one embodiment, in an LDPC parity check matrix H, M=672, N=1344, Z=42 and the new matrix $H_n$ contains 168 rows×1344 columns.

Figure 11:
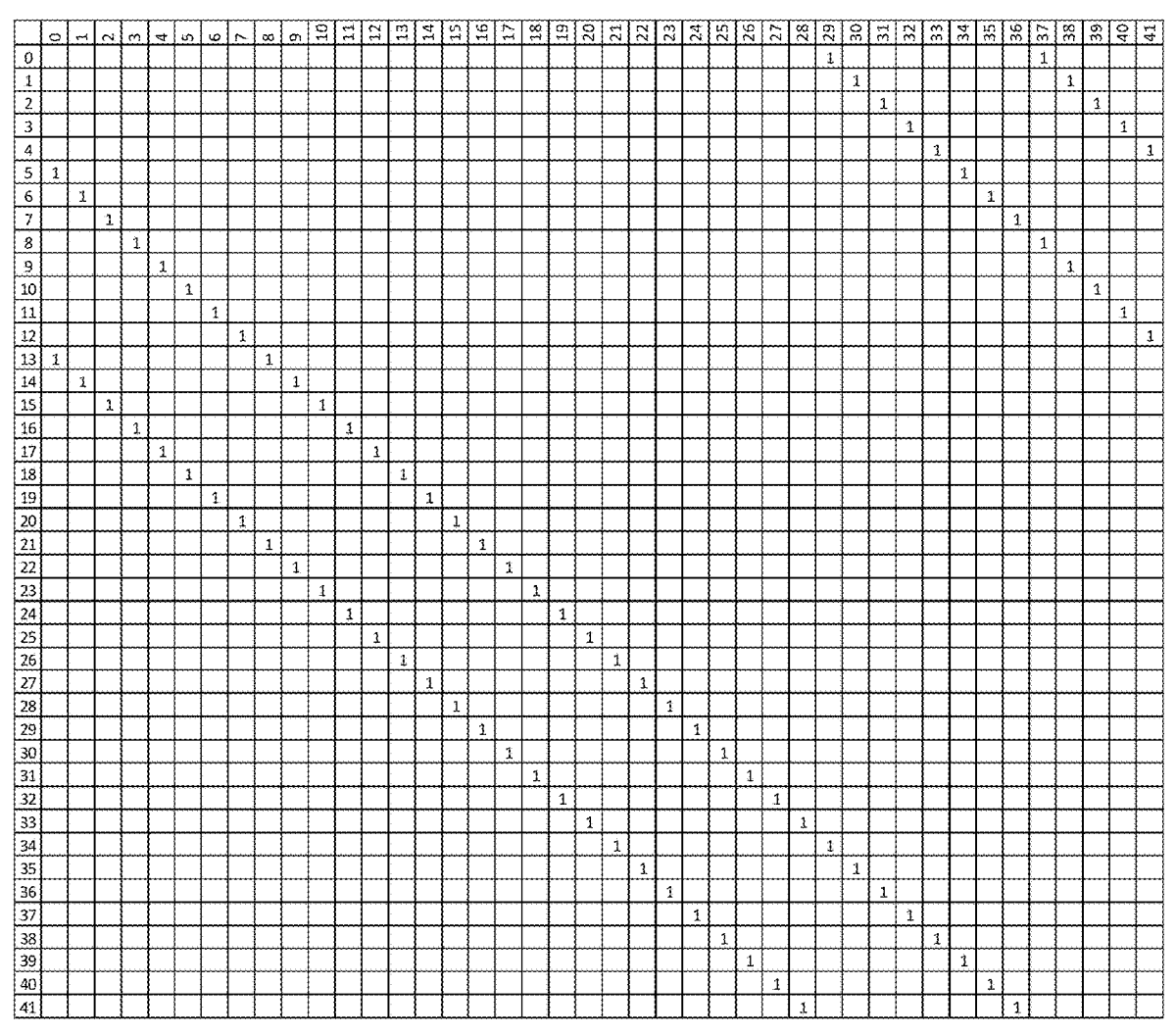

By adding $m_1$, $m_2$, $m_3$, or $m_4$ rows from the M/Z rows of submatrices of the partitioned parity check matrix H to generate a new row, at least one of the submatrices of the new row contains $m_1$, $m_2$ $m_3$, or $m_4$ diagonals of "1", as shown in the example of FIG. 11, which will be discussed below.

In one embodiment, a 7/8 rate LDPC parity check matrix $H_n$ may be generated from the rate 13/16 LDPC code specified in 802.11ad H containing 126 rows×672 columns, Z=42 or rate 13/16 LDPC parity check matrix H containing 252 rows×1344 columns, Z=84.

As shown in FIG. 5D, rate 13/16 LDPC parity check matrix H=126 rows×672 columns, with Z=42. In other words, rate 13/16 LDPC parity check matrix H contains 3(=126/42) rows×16 (=672/42) columns of partitioned submatrices, and each submatrix has a size of 42×42. In on embodiment, the 7/8 rate LDPC code may be obtained by selecting the first row with the second row of partitioned submatrices of the rate 13/16 LDPC parity check matrix H in 802.11ad, and adding the first row with the second row of partitioned submatrices as the first row of the new LDPC parity check matrix $H_n$. The remaining third row is selected as the second row of the new LDPC parity check matrix $H_n$. The new LDPC parity check matrix $H_n$ contains 2 rows×16 columns submatrices of 42×42, as illustrated in FIG. 9A.

Similarly, rate 13/16 LDPC parity check matrix H with codeword length of 1344 contains 3(=252/84) rows×16 (=1344/84) columns of partitioned submatrices, Z=84, and each submatrix has a size of 84×84. In one embodiment, the 7/8 rate LDPC code may be obtained by selecting the first row with the second row of partitioned submatrices of the rate 13/16 LDPC parity check matrix H of codeword length of 1344, and adding the first row with the second row of partitioned submatrices as the first row of the new LDPC parity check matrix $H_n$. The remaining third row is selected as the second row of the new LDPC parity check matrix $H_n$.

In another embodiment, the 7/8 rate LDPC parity check matrix $H_n$ may be generated by selecting the second row of partitioned submatrices of the rate 13/16 LDPC parity check matrix H in 802.11ad as the first row of the new LDPC parity check matrix $H_n$, and then by selecting the first row and the third row of partitioned submatrices of the rate 13/16 LDPC parity check matrix H, and adding the first row with the third row of partitioned submatrices as the second row of the new LDPC parity check matrix $H_n$. Again, the new LDPC parity check matrix $H_n$ contains 2 rows×16 columns submatrices of 42×42, as illustrated in FIG. 10B.

Similarly, the 7/8 rate LDPC parity check matrix $H_n$ may be generated by selecting the second row of partitioned submatrices of the rate 13/16 LDPC parity check matrix H with codeword length 1344, Z=84, as the first row of the new LDPC parity check matrix $H_n$, and then by selecting the first row and the third row of partitioned submatrices of the rate 13/16 LDPC parity check matrix H with codeword length 1344, and adding the first row with the third row of partitioned submatrices as the second row of the new LDPC parity check matrix $H_n$. Again, the new LDPC parity check matrix $H_n$ contains 2 rows×16 columns submatrices of 84×84.

Generally, a 7/8 rate LDPC parity check matrix $H_n$ may be generated from the rate 13/16 LDPC code specified in 802.11ad with H containing 126 rows×672 columns, Z=42 or rate 13/16 LDPC parity check matrix H containing 252 rows×1344 columns, Z=84. First, the LDPC matrix generator 302 may select and add any two rows of partitioned submatrices of the rate 13/16 LDPC parity check matrix H to generate one row of the new 7/8 rate LDPC parity check matrix $H_n$. Second, the LDPC matrix generator 302 may select the remaining one row of partitioned submatrices of the rate 13/16 LDPC parity check matrix H as another row of the new 7/8 rate LDPC parity check matrix $H_n$.

In one embodiment, a 7/8 rate LDPC parity check matrix $H_n$ may be generated from the rate 3/4 LDPC parity check matrix H containing 168 rows×672 columns, with Z=42 or rate 3/4 LDPC parity check matrix H containing 336 rows× 1344 columns, Z=84.

As shown in FIG. 5C, a rate 3/4 LDPC parity check matrix H containing 168 rows×672 columns, with Z=42. In other words, a rate 3/4 LDPC parity check matrix H contains 4(=168/42) rows×16 (=672/42) columns of partitioned submatrices, and each submatrix has a size of 42×42. Similarly, the rate 3/4 LDPC parity check matrix H containing 336 rows×1344 columns, Z=84 also consists of 4 rows×16 columns of partitioned submatrices, and each submatrix has a size of 84×84.

In one embodiment, the parity check matrix of a 7/8 rate LDPC parity check matrix $H_n$, with a codeword length of either 672 or 1344, may be generated by selecting the first row and the third row of partitioned submatrices of the rate 3/4 LDPC parity check matrix H, and adding the first row with the third row of partitioned submatrices as the first row of the new LDPC parity check matrix $H_n$. The remaining second row and the fourth row of the partitioned submatrices may be then selected and added as the second row of the new LDPC parity check matrix $H_n$. FIG. 10A illustrates the new rate 7/8 LDPC parity check matrix $H_n$ contains submatrices of 2 rows×16 columns, each with a size of Z×Z, where Z=42×42.

In another embodiment, a 7/8 rate LDPC parity check matrix $H_n$, with a codeword length of either 672 or 1344, may be generated by first selecting the second row and the third row of partitioned submatrices of the rate 3/4 LDPC parity check matrix H, and adding the selected second row and the third row of partitioned submatrices as the first row of the new LDPC parity check matrix $H_n$. The remaining first row and the fourth row of the partitioned submatrices may then be selected and added as the second row of the new LDPC parity check matrix $H_n$. FIG. 10B illustrates the new LDPC parity check matrix $H_n$ contains submatrices of 2 rows×16 columns, each with a size of Z×Z, where Z=42.

Generally, a 7/8 rate LDPC parity check matrix $H_n$, with a codeword length of either 672 or 1344, may be generated from the rate 13/16 LDPC parity check matrix H, by selecting and adding any two rows of partitioned submatrices of the rate 13/16 LDPC parity check matrix H as the first row of the new 7/8 rate LDPC parity check matrix $H_n$, and using the remaining one row as the second row of the new 7/8 rate LDPC parity check matrix $H_n$. If the codeword length is 672, Z=42; if the codeword length is 1344, Z=84.

As well, a 7/8 rate LDPC parity check matrix $H_n$, with a codeword length of either 672 or 1344, may be generated from the rate 3/4 LDPC parity check matrix H, by selecting and adding any two or more rows of partitioned submatrices of the rate 3/4 LDPC parity check matrix H as the first row of the new 7/8 rate LDPC parity check matrix $H_n$, and by adding the remaining one or more rows as the second row of the new 7/8 rate LDPC parity check matrix $H_n$. If the codeword length is 672, Z=42; if the codeword length is 1344, Z=84.

Similarly, a 7/8 rate LDPC parity check matrix $H_n$, with a codeword length of either 672 or 1344, may be generated from the rate 1/2 or 5/8 LDPC parity check matrix H, by adding any two or more rows of partitioned submatrices of the rate 1/2 or 5/8 LDPC parity check matrix H as the first row of the new 7/8 rate LDPC parity check matrix $H_n$, and then adding the remaining rows as the second row of the new 7/8 rate LDPC parity check matrix $H_n$. If the codeword length is 672, Z=42, if the codeword length is 1344, Z=84.
Codeword Length=1344, Z=42

In one embodiment, a 7/8 rate LDPC code with a codeword length of 1344 may be generated from the rate 13/16 LDPC parity check matrix H containing 336 rows×1344 columns, Z=42. As shown in FIG. 6A, the generated matrix 606 H has submatrices of 6 rows×32 columns, each submatrix has a size of a 42×42. In one embodiment, any three rows of the submatrices of the generated 1344 code matrix 606 in FIG. 6A may be added as one row of the new 7/8 rate LDPC parity check matrix $H_n$, and the remaining three rows become the three row of the 7/8 rate LDPC matrix $H_n$ with codeword length 1344. In this case, the 7/8 rate LDPC matrix $H_n$ with codeword length 1344 has submatrices of 4 rows×32 columns, Z=42.

In another embodiment, any two rows of the submatrices may be selected from the six rows of the generated matrix 606 H with codeword length 1344 in FIG. 6A. The two selected rows then may be added as one row of the new 7/8 rate LDPC parity check matrix $H_n$. Another two rows may be selected from the remaining four rows of the submatrices of matrix 606 H and added as another row of the new 7/8 rate LDPC parity check matrix $H_n$. The remaining two rows of matrix 606 H become the remaining two rows of the 7/8 rate LDPC matrix $H_n$ with codeword length 1344. In this case, the 7/8 rate LDPC matrix $H_n$ with codeword length 1344 has submatrices of 4 rows×32 columns, Z=42.

In one embodiment, the selected rows are derived from different rows of the base parity check matrix 604.

In one embodiment, a K/N rate LDPC parity check matrix $H_n$ and/or its corresponding generator matrix G, for example, 7/8 rate LDPC parity check matrix $H_n$ and/or its corresponding generator matrix G, may be pre-stored in a memory of a transmitter for encoding a source word or in a memory of a receiver for decoding a demodulated codeword.

In the examples of FIGS. 9A-9B, and 10A-10B, as a result of adding two rows of the partitioned submatrices of the rate 13/16 or 3/4 LDPC parity check matrix H, in the 7/8 rate LDPC matrices generated above, a double cyclic shift permutation matrix may present in some submatrices. In FIGS. 9A-9B and 10A-10B, the "-" denotes null submatrices with all zero entries. The double cyclic shift permutation matrix presents if the two combining submatrices are not the null submatrices with all zero entries.

For example, the submatrix in FIG. 9A indicated with "37+29" in parity-check matrix $H_n$ of the 7/8 code obtained by adding first row with the second row of the rate 13/16 parity-check matrix H of the LDPC in 802.11ad, or adding the second row with the third row of the rate 3/4 parity-check matrix H of the LDPC in 802.11ad, as the first row of the new LDPC parity check matrix $H_n$. As illustrated in FIG. 11, the submatrix indicated with "37+29" shows two diagonals of "1". The first diagonal of "1" is from columns 0-36 and then from columns 37-41, and the second diagonal of "1" is from columns 0-28 and then from columns 29-41.

When two rows are added, the variable node degree distribution of the code remains unchanged, while the degree of the check nodes doubles, namely, there are two "1" in each row. For Example, in FIG. 11, at row "10", there are two "1"s: one at column 5, the other at column 40.

As described above, in the example of codeword length of 672, when the LDPC matrix generator 302 generates a new K/N rate LPDC code matrix $H_n$ with from the partitioned parity check matrix H, the LDPC matrix generator 302 may first add $m_1$ rows of the submatrices of the partitioned parity check matrix H as one row of submatrices of the new matrix $H_n$ (step 806), and optionally, $m_2$ rows selected from the remaining submatrices of the partitioned parity check matrix H may also be added as a second row of submatrices of the new matrix $H_n$ (step 808), where $m_1$ and $m_2$ are integers, $m_1+m_2=<M/Z$, $m_1>1$ and $m_2>=1$. In the example of codeword length of 1344, $m_3$ and $m_4$ rows may also be selected from the remaining submatrices of the partitioned parity check matrix H, and may also be added as a third or fourth row of the new matrix $H_n$. In this case, $m_1+m_2+m_3+m_4=<M/Z$, $m_1>1$, $m_2>=1$, $m_3>=1$, and $m_4>=1$.

By adding $m_1$, $m_2$, $m_3$, and/or $m_4$ rows from the M/Z rows of submatrices of the partitioned parity check matrix H to generate a new row of submatrices, at least one of the submatrices of the new row contains $m_1$ $m_2$, $m_3$, or $m_4$ diagonals of "1", if the at least one submatrix are generated by all of the $m_1$ $m_2$, $m_3$, or $m_4$ non-null submatrices. When $m_1$ $m_2$, $m_3$, or $m_4$ rows are added, the variable node degree distribution of the code remains unchanged, while the degree of the check nodes is $m_1$ $m_2$, $m_3$, or $m_4$, namely, there are $m_1$ $m_2$, $m_3$, or $m_4$ "1"s in each row.

Juxtaposition

Figure 12:
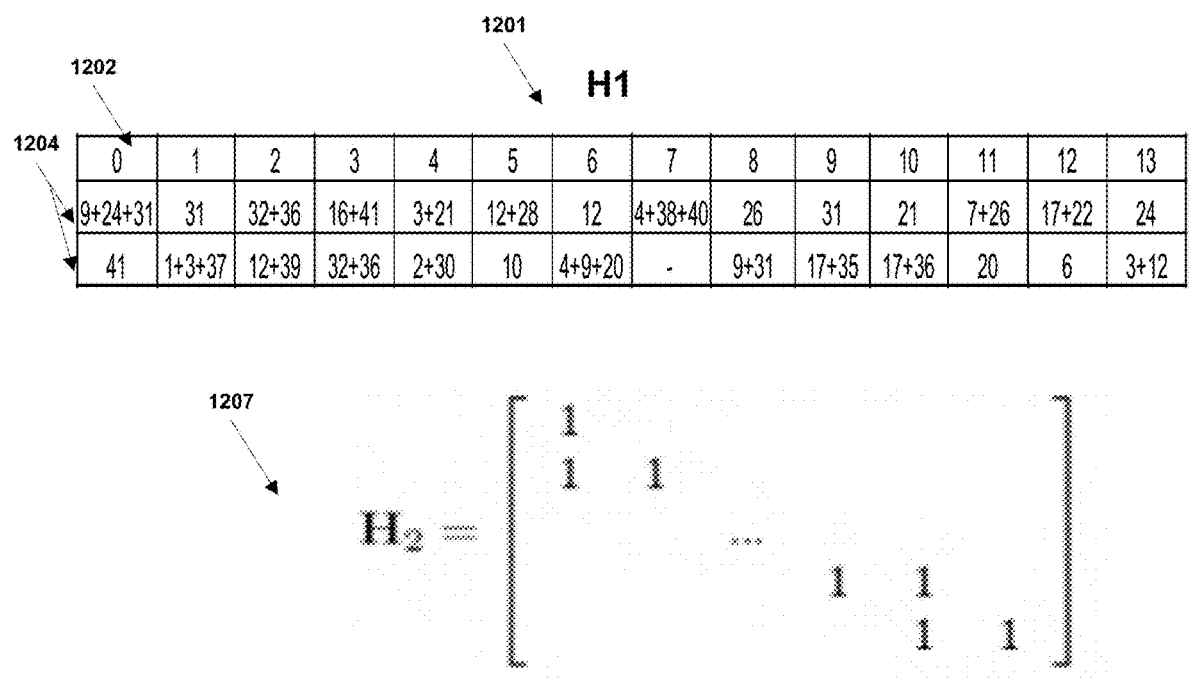
FIG. 12 is a diagram illustrating example LDPC parity check matrices $H_n$ generated according to one embodiment of the present disclosure.

The LDPC codes may be constrained to an enhanced irregular repeat accumulate (eIRA) code structure, characterized by an (n–k, n) parity-check matrix obtained by juxtaposing of two matrices H=[$H_1H_2$], where $H_1$ is a (n–k)×(k) systematic part, which is a block-structured matrix whose constituent submatrices are Z×Z null or cyclically shifted identity matrices, and $H_2$ is a full-rank (n–k)×(n–k) matrix whose column are weigh 2 except for the last one, as shown in FIG. 12.

To increase the largest variable-node degree, a fact that can improve the error-floor performance, the design algorithm allows, when necessary, constituent submatrices with two or more diagonals with different cyclic shifts. For example, in FIG. 12, the submatrix with the value "9+24+31" contains three diagonals.

In FIG. 12, the first row 1202 is a submatrix index and does not form part of H1. The second and third rows 1204 are the submatrices of H1 and are used to generate the LDPC matrix H.

In one embodiment, to generate a rate 7/8 LDPC matrix H with parameters K=588, N=672, and Z=42, the matrix H1 1201 of the code has only 2 rows 1204 of submatrices of size 42×42, In the example of FIG. 12, the variable node degree may be up to 4, for example, the first column (9+24+31)+41. H2 is a 84×84 full-rank matrix, with Z=42.

As shown in FIG. 12, H1 contains submatrices of 2 rows×14 columns, with Z=42. H2 is a 84×84 full-rank matrix the size of which is equivalent to submatrices of 2 rows×2 columns, with Z=42. Therefore, the size of H=[H1H2] is equivalent to submatrices of 2 rows×16 columns, Z=42.

In one embodiment, to generate a rate 7/8 LDPC matrix H with parameters K=1176, N=1344, and Z=84, the matrix H1 1201 of the code has only 2 rows 1204 of submatrices of size 84×84. H2 is a 168×168 full-rank matrix.

As shown in FIG. 12, H1 contains submatrices of 2 rows×14 columns, with Z=84. H2 is a 168×168 full-rank matrix the size of which is equivalent to submatrices of 2 rows×2 columns, with Z=84. Therefore, the size of H=[H₁H₂] is equivalent to submatrices of 2 rows×16 columns, Z=84.

Performance

Figure 13A:
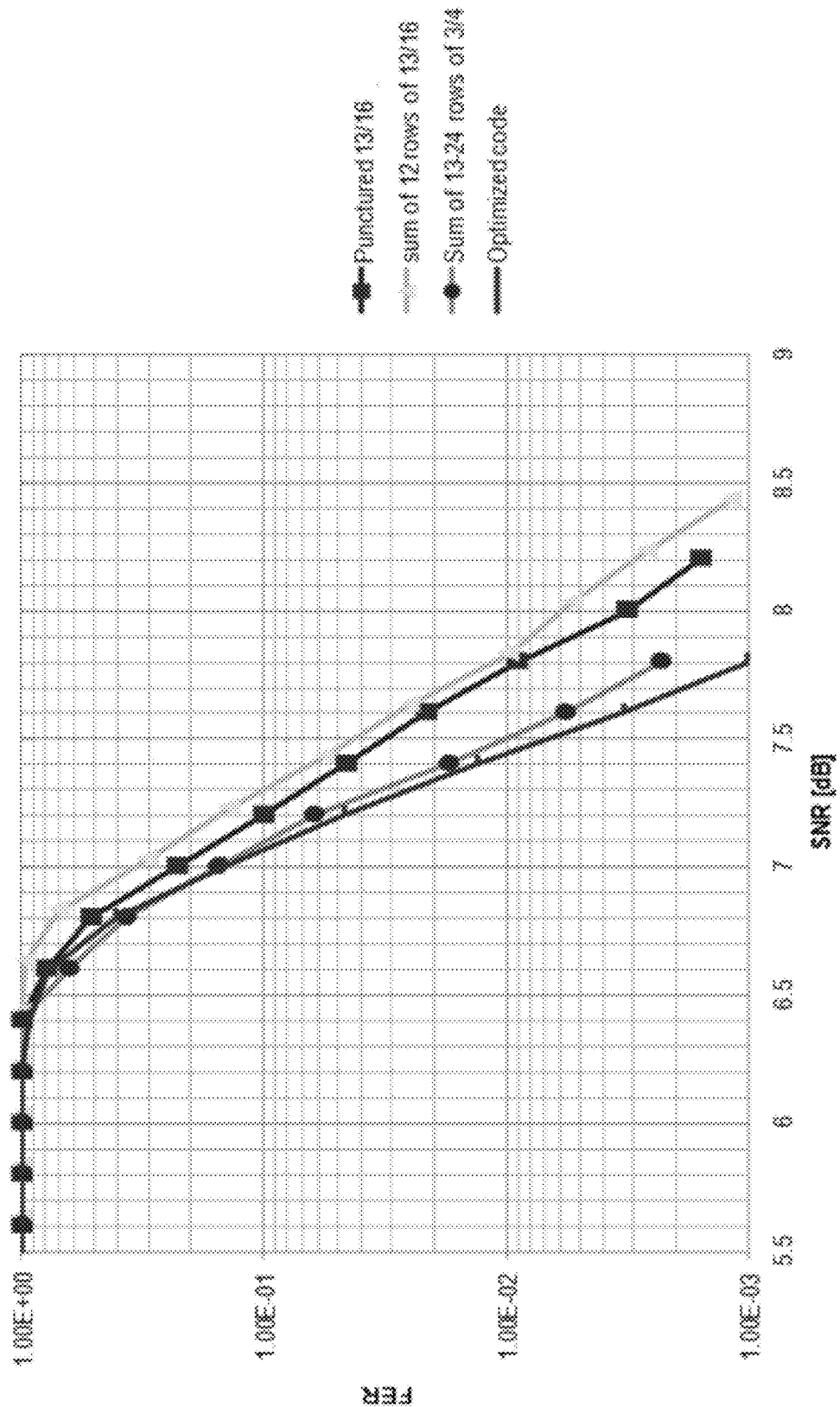
FIGS. 13A-13C are diagrams illustrating performance of various LDPC codes using different modulation methods.
Figure 13B:
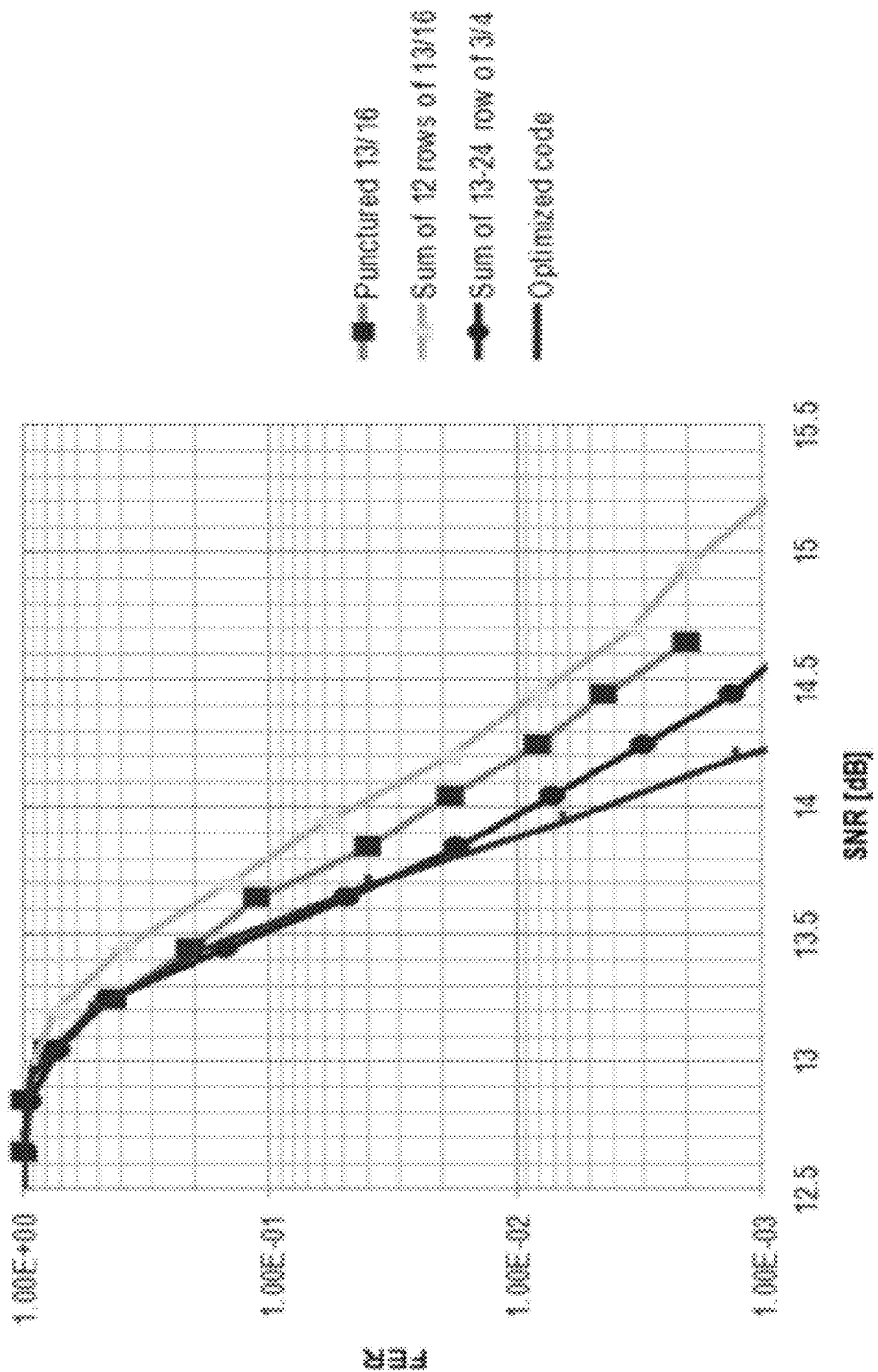
Figure 13C:
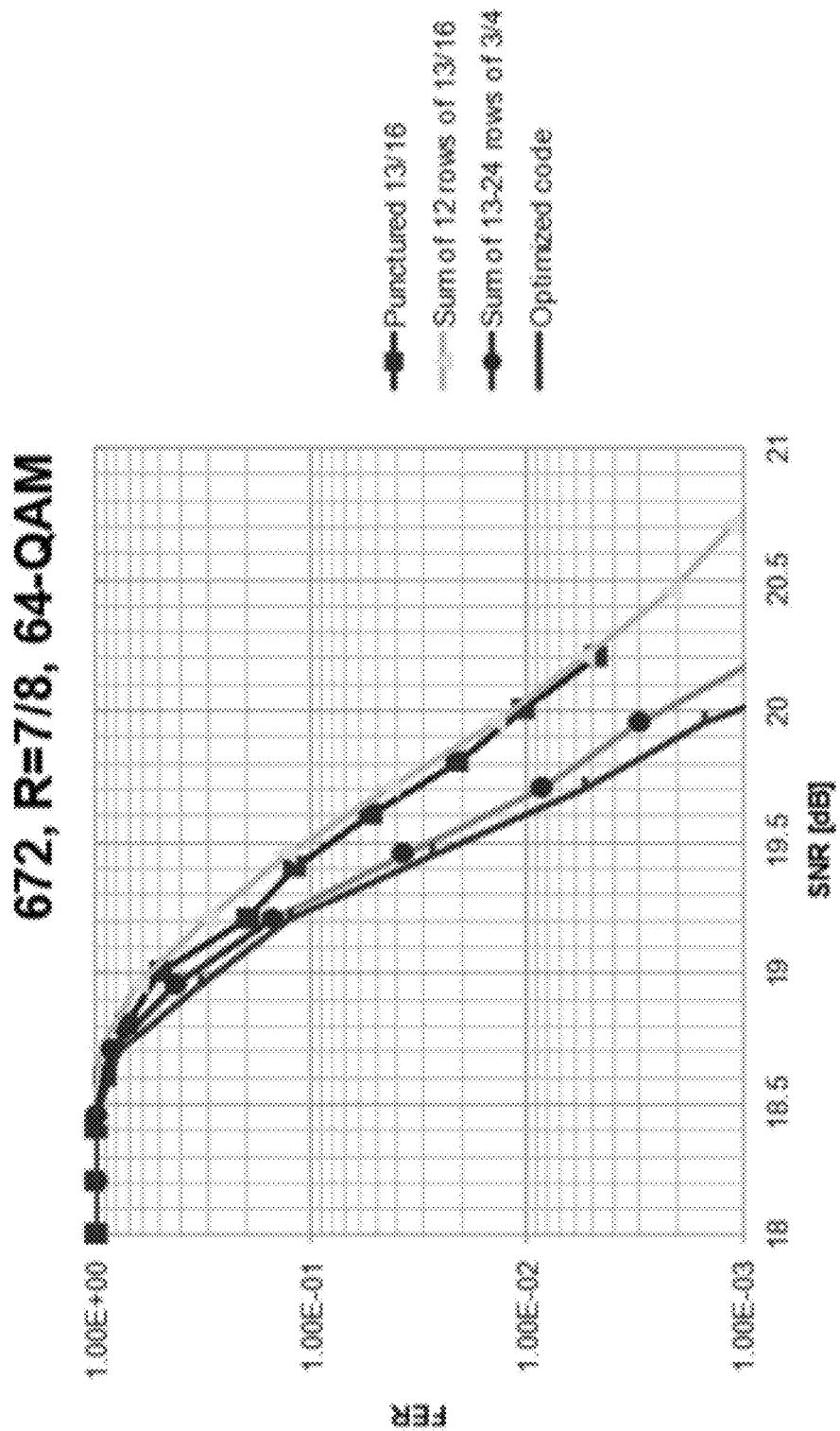

The examples of FIGS. 13A-13C show the performances of rate 7/8 of N=672 codes $H_n$, Z=42, generated by puncturing 13/16 code; adding rows 1 and 2 of a 13/16 code of 802.11ad; adding rows 1 and 3, and rows 2 and 4 of 3/4 code and optimized code by juxtaposing H1 and H2. The codewords in FIGS. 13A, 13B, and 13C are modulated by QPSK, 16QAM, and 64QAM, respectively.

As shown in FIGS. 13A, 13B, and 13C, with a given signal to noise ratio (SNR) value, the 7/8 rate LDPC parity check $H_n$ generated by adding rows 1 and 3, and rows 2 and 4 of 3/4 code and optimized code by juxtaposing H1 and H2 generally yield a lower frame error rate (FER). Alternatively, the 7/8 rate LDPC parity check $H_n$ generated by adding rows 1 and 3, and rows 2 and 4 of 3/4 code and optimized code by juxtaposing H1 and H2 require lower SNR values to achieve a given FER.

With respect to the 7/8 code generated by adding rows 1 and 2 of the 13/16 code, for a given SNR, the 7/8 rate LDPC parity check $H_n$ generated by adding rows 1 and 2 generally has a slightly higher FER. However, since the codeword length of this code is 672, which is the same as that of other codes specified in 802.11ad, the implementation of blocking and de-blocking of this 7/8 rate LDPC parity check $H_n$ is unchanged while the implementation of blocking and de-blocking of the 7/8 code punctured from the 13/16 code of 802.11ad requires extra modification at the transmitter and the receiver.

Figure 14A:
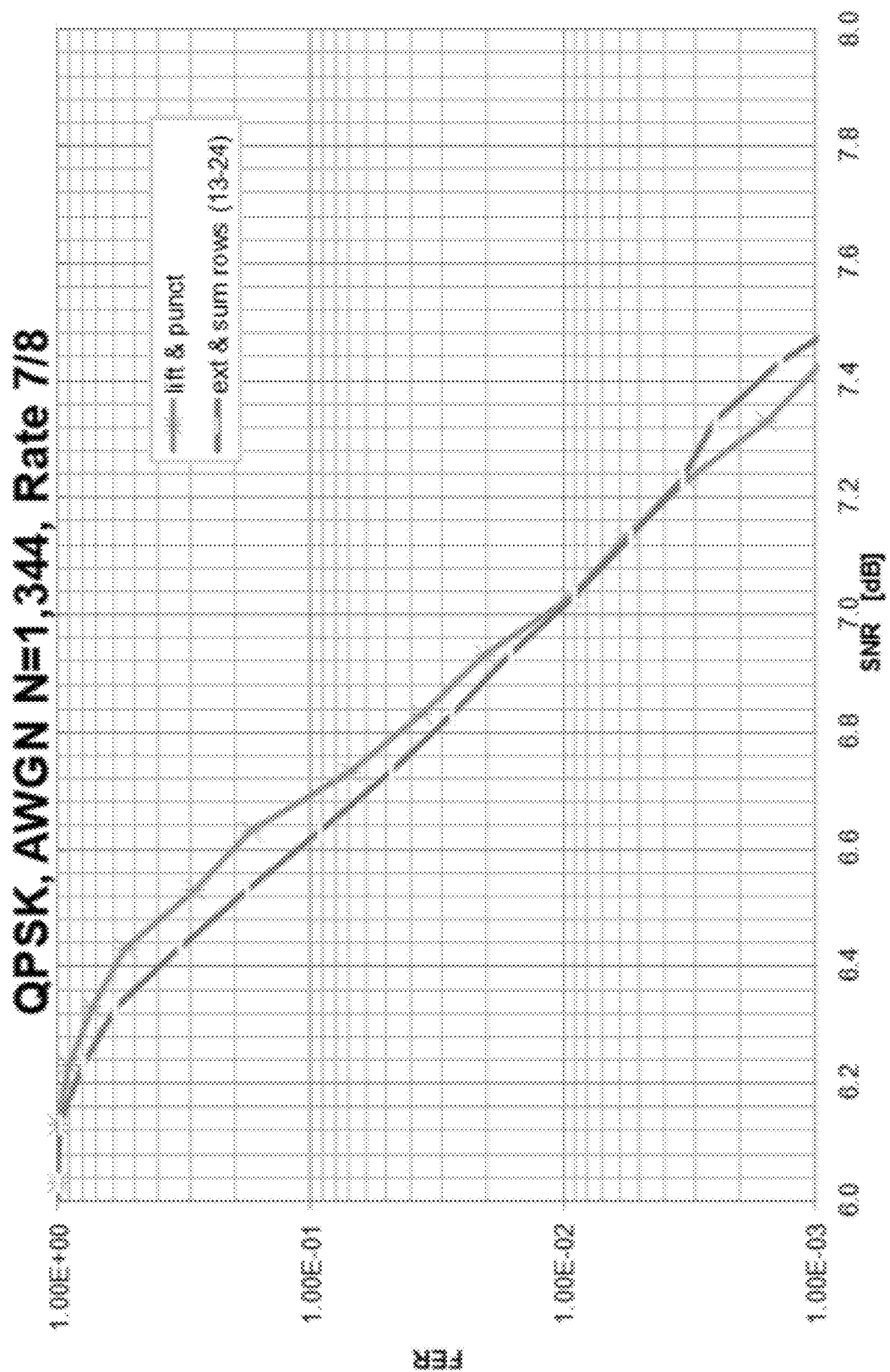
FIGS. 14A-14C are diagrams illustrating performance of various LDPC codes using different modulation methods.
Figure 14B:
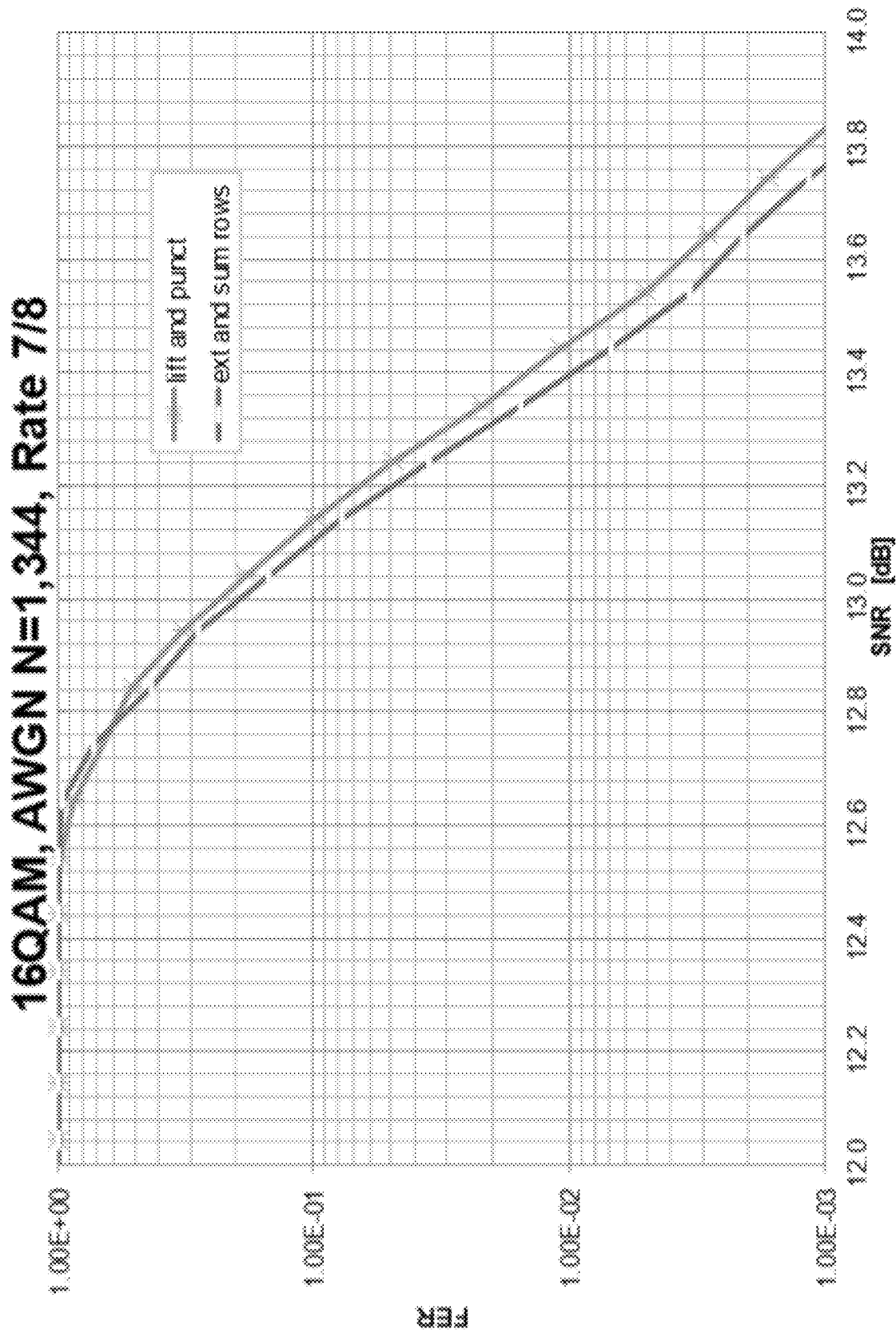
Figure 14C:
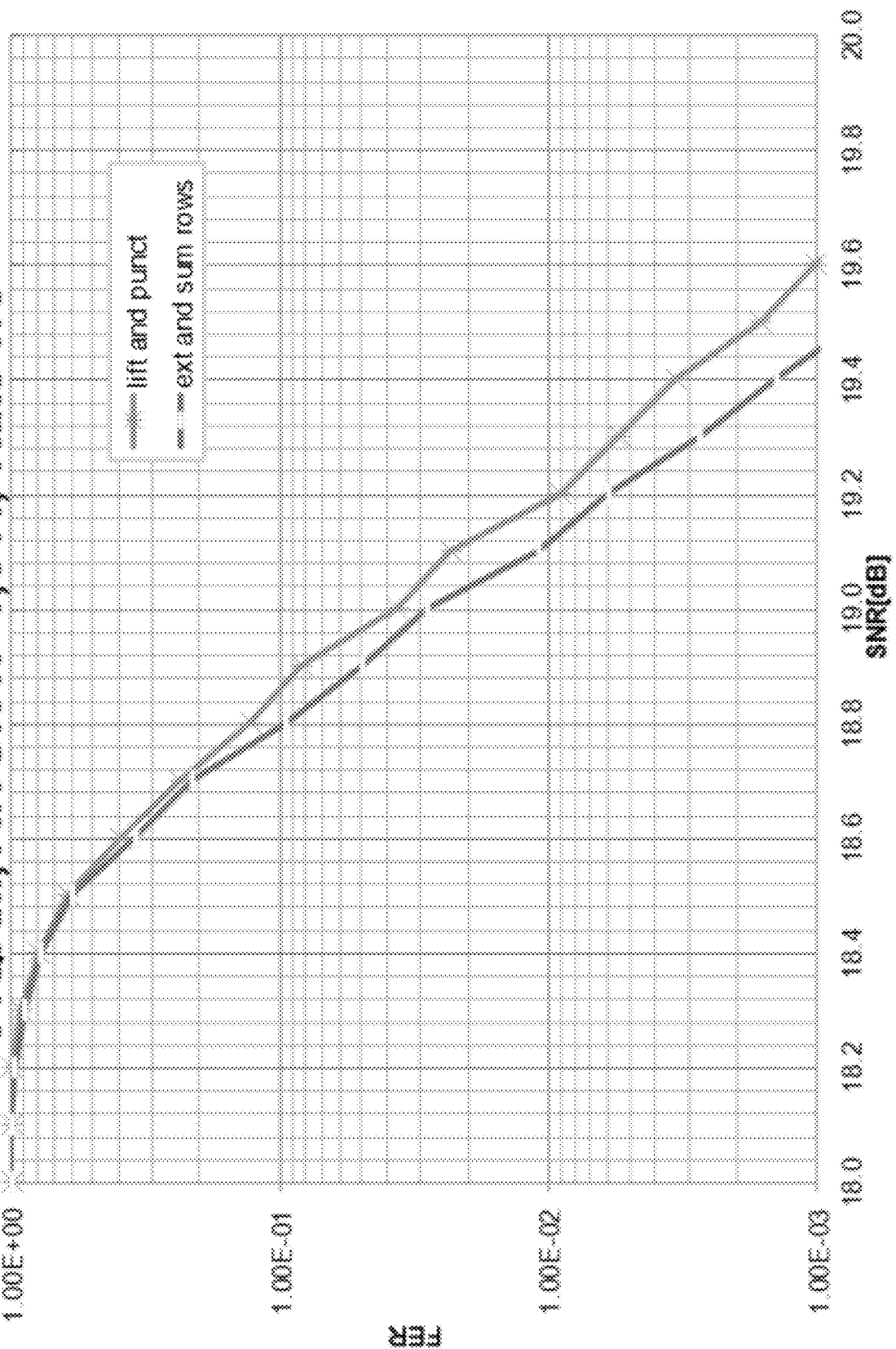

The Examples of FIGS. 14A-14C show the performances of rate 7/8 of N=1344 codes $H_n$, Z=42, generated by puncturing 13/16 code (n=1248, K=1092), and by adding rows 1 and 3, and rows 2 and 4 of 3/4 code. The codewords in FIGS. 14A, 14B, and 14C are modulated by QPSK, 16QAM, and 64QAM, respectively. As FIGS. 14A, 14B, and 14C, with a given signal noise ratio (SNR), the 7/8 rate LDPC parity check $H_n$ generated by rows 1 and 3, and rows 2 and 4 of 3/4 code generally have a lower frame error rate (FER).

Decoder & Decoding Method

Figure 15A:
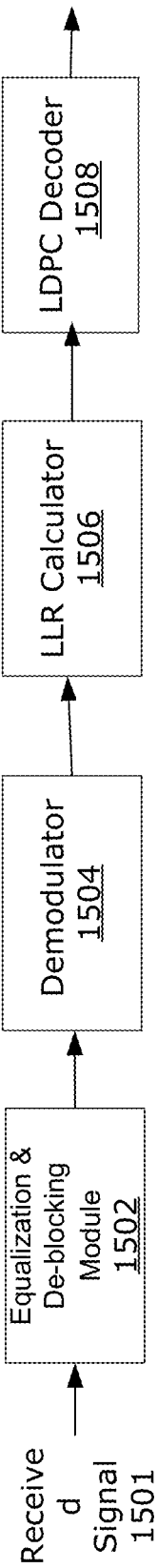
FIG. 15A is a block diagram representing an example implementation of a receiver of the present disclosure.
Figure 15B:
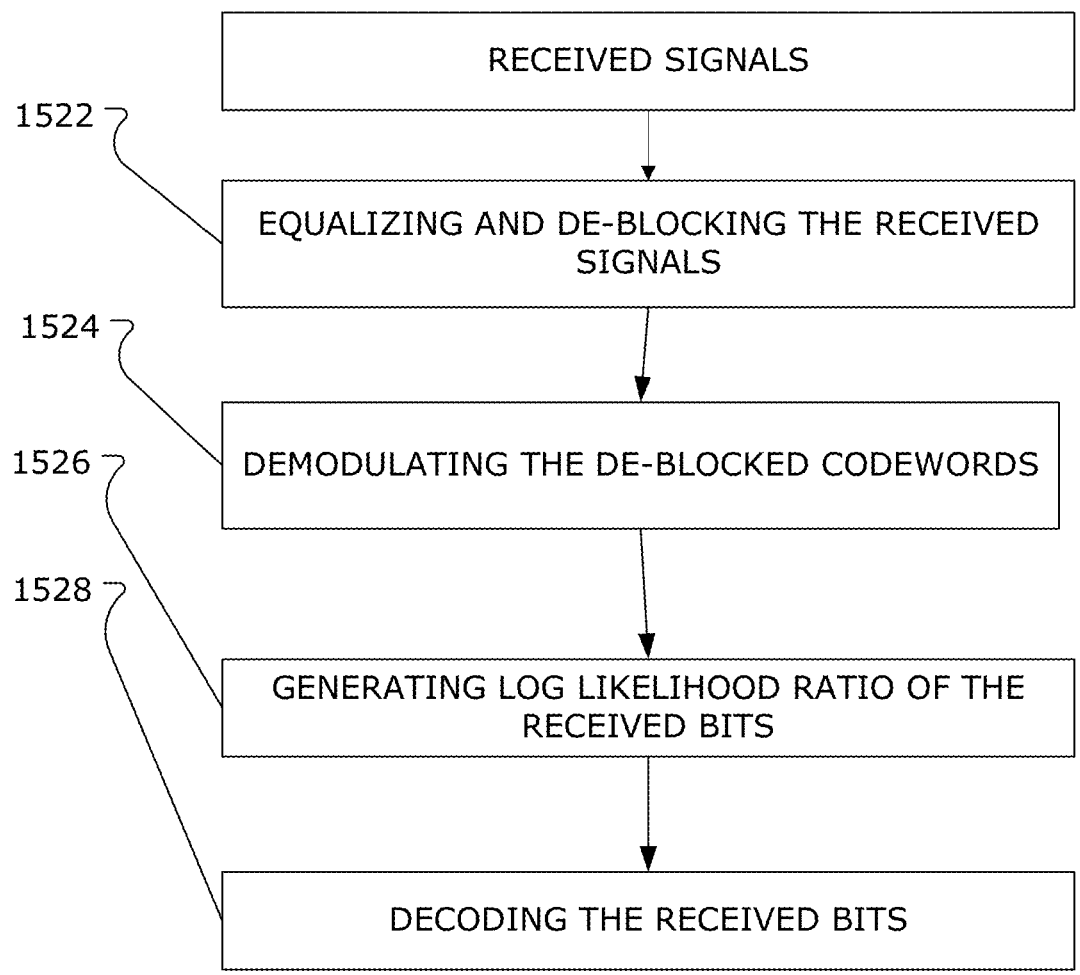
FIG. 15B is a block diagram representing an example steps in a process of decoding a received signal according to one embodiment of the present disclosure.
Figure 16:
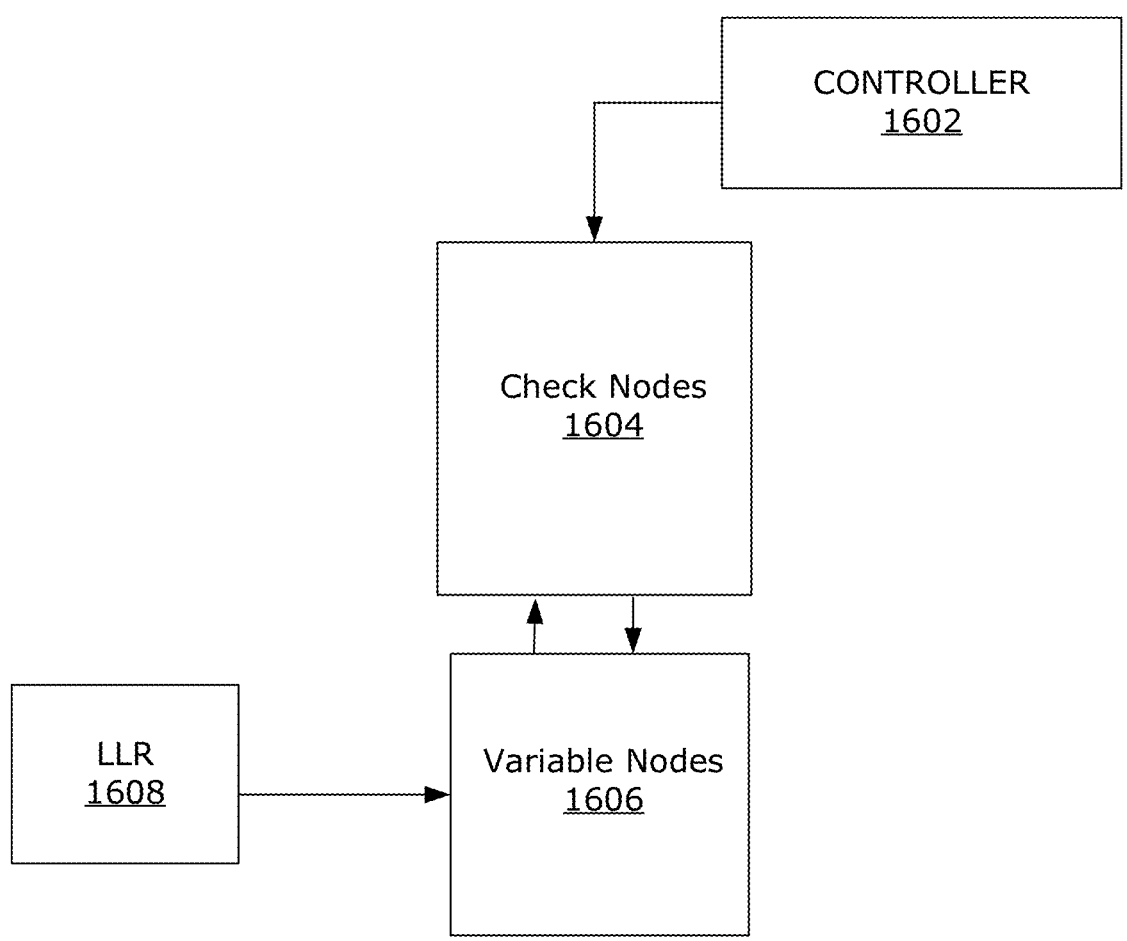
FIG. 16 is a block diagram representing an example implementation of an LDCP decoder of the present disclosure.

An LDPC encoded signal may be received at a receiver of the STA 102 or AP 104. As illustrated in the example of FIG. 15A, the receiver includes an equalization and de-blocking module 1502, a demodulator 1504, an LLR calculator 1506, and an LDPC decoder 1508. Optionally, the LLR calculator 1506 can be a component of the demodulator 1504. As shown in FIG. 15B, with the received LDPC encoded signal, the equalization and de-blocking module 1502 first equalizes the received signal 1501 to reduce intersymbol interference caused by the channel through which the received signal is transmitted, and then de-blocks the equalized signal to recover the codewords symbols (step 1522). The demodulator 1504 demodulates the de-blocked codewords symbols to codewords in bits (step 1524), for example, by BPSK, QPSK, 16QAM, or 64QAM. An LLR calculator 1504 may be used to generate a log likelihood ratio of the bits value of de-blocked codeword symbols (step 1526). The log likelihood ratio may be used as the input of the LDPC decoder 1508. The LDPC decoder 1508 may then use the LDPC matrix $H_n$ that is used in encoding the source words to decode the demodulated signal, the signal having a 1×N row vector S (step 1528). The LDPC decoder 1508 generates a 1×N row vector $\bar{c}=[c_1, \ldots, c_n]$ to recover a 1×K source word row vector $\bar{u}$. To be a valid codeword $\bar{c}=[c_1, \ldots, c_n]$, the $H\bar{c}^T=0$. Various algorithms are available to decode the LDPC encoded signal, for example, message passing algorithm. FIG. 16 is an example LDPC decoder using message passing algorithm to decode the LDPC encoded source words. Other decoding algorithm may also be used to implement the LDPC decoding. In the case of message passing algorithm is used, the LDPC decoder 1508 may include a controller 1602, a check nodes module 1604 and a variable node module 1606.

As described above, the LDPC encoding information of the transmitted signal may be included in the frame transmitted, such as the information of the K/N rate LPDC code $H_n=(N-K)\times N$ LDPC matrix used to encode the source words. In one embodiment of the present application, a K/N rate LPDC code $H_n=(N-K)\times N$ may be used, at the LDPC decoder 1508, with a lifting factor of Z. As described in the encoding process, $H_n$ comprises a plurality of submatrices, and each submatrix has a size of Z×Z. At least one submatrix in $H_n$ comprises $m_1$ diagonals of "1", where $m_1$ is an integer>=2. The methods of generating the parity check matrix have been described in the encoding process.

Figure 17:
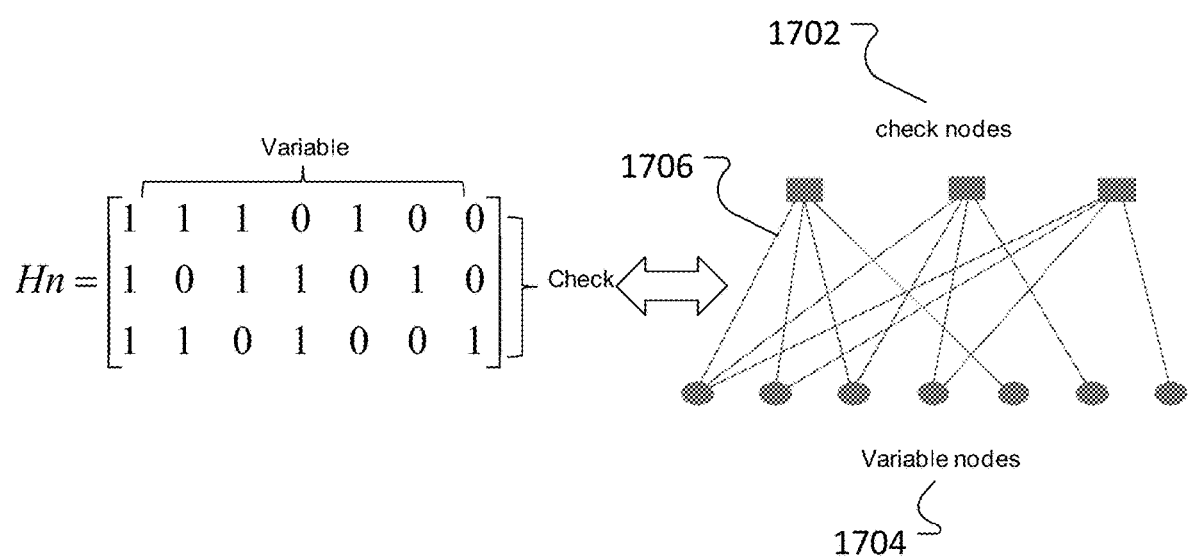
FIG. 17 is a diagram illustrating an example LDPC decoding process.

The codewords in bits may be decoded with the $H_n$, for example, using the message passing algorithm (MPA) with the LLR values. As illustrated in the example of FIG. 17, the LDPC decoding with MPA is an iterative decoding algorithm that uses the structure of the Tanner graph, which is the graphical representation of the LPDC parity check matrix $H_n$. In the LDPC decoder 1508, each check node 1702 determines the value of an erased bit based on the LLR value if it is the only erased bit in its parity-check equation. The messages passed along the Tanner graph edges 1706. For each iteration of the algorithm, each variable node 1704 sends a message ("extrinsic information") to each check node 1702 to which the variable node 1704 is connected. Each check node 1702 sends a message ("extrinsic information") to variable nodes 1704 to which the check node 1702 is connected. "Extrinsic" in this context means that the information the check nodes 1702 or variable nodes 1704 already possess is not passed to that node. A posteriori probability for each codeword bit is calculated based on the received signal at the LLR calculator 1506 and the parity constraints defined in the $H_n$, namely, to be a valid codeword $\bar{c}=[c_1, \ldots, c_n]$, the $H\bar{c}^T=0$.

In decoding, as at least one submatrix in $H_n$ comprises $m_1$ diagonals of "1", where $m_1$>=2, the presence of superimposed layers in the parity-check matrix $H_n$ has a minor impact in the implementation of the LDPC decoder 1508, which may be assumed to have a layered architecture.

In a layered architecture of the LDPC decoder 1508, Z parallel check node processors process sequentially the messages of the edges relative to a submatrix of Z rows of the parity-check matrix. In an example, Z=42 and the edges are 16. The cyclic shift structure simplifies the decoder architecture that allows to feed the parallel processors with a simple barrel shifter. When the processing of a layer is terminated, the parity-check processors are re-initialized and the next layer is processed.

When $m_1$ rows are superimposed the parity-check node, at least one submatrix in $H_n$ comprises $m_1$ diagonals of "1", where $m_1$ is an integer>=2. processors are not initialized after the end of the first layer but rather they continue processing the next 16 edges of the superimposed submatrix-row. This process will repeat for $m_1$ times. The decoding complexity thus remains the same as the one of the original code, and the existing hardware architecture can be reused.

The present disclosure provides certain example algorithms and calculations for implementing examples of the disclosed methods and systems. However, the present disclosure is not bound by any particular algorithm or calculation. Although the present disclosure describes methods and processes with steps in a certain order, one or more steps of the methods and processes may be omitted or altered as appropriate. One or more steps may take place in an order other than that in which they are described, as appropriate.

Through the descriptions of the preceding embodiments, the present invention may be implemented by using hardware only, or by using software and a necessary universal hardware platform, or by a combination of hardware and software. Based on such understandings, the technical solution of the present invention may be embodied in the form of a software product. The software product may be stored in a non-volatile or non-transitory storage medium, which can be a compact disk read-only memory (CD-ROM), USB flash drive, or a hard disk. The software product includes a number of instructions that enable a computer device (personal computer, server, or network device) to execute the methods provided in the embodiments of the present invention.

Although the present invention and its advantages have been described in detail, it should be understood that various changes, substitutions and alterations can be made herein without departing from the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

The invention claimed is:

1. A method, performed at a transmitter, for encoding a source word, comprising:
   receiving a 1×K source word row vector $\bar{u}$; and
   generating a 1×N codeword vector $\bar{c}=\bar{u}\cdot G$, wherein
   G is a K×N generator matrix, and wherein G is derived from a parity check matrix $H_n$,
   the parity check matrix $H_n$ having a lifting factor Z, wherein Z is an integer greater than 0, and wherein
   the parity check matrix $H_n$ comprises a plurality of submatrices, each submatrix having a size Z×Z, and wherein at least one submatrix has $m_1$ cyclically shifted diagonals of "1", and wherein $m_1$ is an integer>=2; and
   wirelessly transmitting a signal including the generated codeword vector;
   wherein the parity check matrix $H_a$ is generated by
      partitioning a first M×N parity check matrix H, with the lifting factor of Z, wherein M=I×Z, N=J×Z, and wherein I and J are integers, I>2 and J>0, into square submatrices having a size of Z×Z, wherein the first M×N parity check matrix H contains (M/Z) rows× (N/Z) columns of the submatrices;
      selecting $m_1$ rows from the M/Z rows of the submatrices of the first M×N parity check matrix H; and
      adding the $m_1$ rows of the submatrices of the first M×N parity check matrix H as a row of submatrices of the parity check matrix $H_n$, and $m_1$ is a integer>=2.

2. The method of claim 1, wherein the parity check matrix $Hn=[P_{(n-k)\times k} I_{(n-k)}]$, where $P_{(n-k)\times k}$ is a binary matrix and $I_{(n-k)}$ is an identity matrix of order n–k; and wherein the generator matrix G is derived from the parity check matrix $H_n$ such that $GH_n^T=0$, where "T" denotes a matrix transpose.

3. The method of claim 1, further comprising adding $m_2$ rows from the remaining rows of the submatrices of the first M×N parity check matrix H as a second new row of submatrices of the parity check matrix $H_n$, and $m_2$ is an integer>=1.

4. The method of claim 3, wherein N=672, Z=42, K=588, and the parity check matrix $H_n$ comprises 84 rows×672 columns.

5. The method of claim 1, further comprising:
   adding $m_2$ rows from remaining (M/Z–$m_1$) rows of the submatrices of the first M×N parity check matrix H as a second submatrix row of the parity check matrix $H_n$;
   adding $m_3$ rows from remaining (M/Z–$m_1$–$m_2$) rows of the submatrices of the first M×N parity check matrix H as a third submatrix row of the parity check matrix $H_n$; and
   adding $m_4$ rows from remaining (M/Z–$m_1$–$m_2$–$m_3$) rows of the submatrices of the first M×N parity check matrix H as a fourth submatrix row of the parity check matrix $H_n$,
   wherein N=1344, Z=42, $m_1$, $m_2$, $m_3$, and $m_4$ are integers, $m_1+m_2+m_3+m_4$=<M/Z, $m_1$>1 $m_2$>=1, $m_3$>=1, and $m_4$>=1.

6. The method of claim 1, wherein the first M×N parity check matrix H is a code rate 3/4 Low LDPC matrix specified in 802.11ad, wherein the first M×N parity check matrix H=168 rows×672 columns, and Z=42, and wherein the parity check matrix $H_n$ is generated with parameters $m_1$=2 and $m_2$=2, Z=42.

7. The method of claim 6, wherein the parity check matrix $H_n$ is

| 37 + 35 | 31 + 19 | 18 + 41 | 23 + 22 | 11 + 40 | 21 + 41 | 6 + 39 | 20 + 6 | 32 + 28 | 9 + 18 | 12 + 17 | 29 + 3 | — + 28 | 0 + — | 13 + — | — + — |
| 25 + 29 | 22 + 30 | 4 + 0 | 34 + 8 | 31 + 33 | 3 + 22 | 14 + 17 | 15 + 4 | 4 + 27 | — + 28 | 14 + 20 | 18 + 27 | 13 + 24 | 13 + 23 | 22 + — | 24 + — |

8. A method, performed at a receiver, for decoding a codeword, comprising:
   wirelessly receiving a signal having a 1×N row vector S; and
   decoding the 1×N row vector S with a parity check matrix $H_n$ that is used in an encoding process; and
   generating a 1×N vector $\bar{c}=[c_1, \ldots, c_n]$ such that $Hn\bar{c}^T=0$ to recover a 1×K source word row vector $\bar{u}$, where "T" denotes a matrix transpose and wherein
   the parity check matrix $H_n$ comprises a plurality of submatrices, the parity check matrix $H_n$ having a lifting factor Z, each submatrix having a size of Z×Z, wherein Z is an integer greater than 0, and wherein at least one submatrix has $m_1$ cyclically shifted diagonals of "1", and wherein $m_1$ is an integer>=2; and wherein the parity check matrix $H_n$ is generated by
partitioning a first M×N parity check matrix H, with the lifting factor of Z, wherein M=I×Z, N=J×Z, and wherein I and J are integers, I>2 and J>0, into square submatrices of a size Z×Z, wherein the first M×N parity check matrix H contains (M/Z) rows×(N/Z) columns of the submatrices;

selecting $m_1$ rows from the M/Z rows of the submatrices of the first M×N parity check matrix H; and adding the $m_1$ rows of the submatrices of the first M×N parity check matrix H as a row of submatrices of the parity check matrix $H_n$, and $m_1$ is a integer>=2.

9. The method of claim 8, further comprising adding $m_2$ rows from the remaining rows of the submatrices of the first M×N parity check matrix H as a second new row of submatrices of the parity check matrix $H_n$, and $m_2$ is an integer>=1.

10. The method of claim 8, wherein N=672, Z=42, K=588, and the parity check matrix $H_n$ comprises 84 rows× 672 columns.

11. The method of claim 8, further comprising:
adding $m_2$ rows from remaining (M/Z-$m_1$) rows of the submatrices of the first M×N parity check matrix H as a second submatrix row of the parity check matrix $H_n$;
adding $m_3$ rows from remaining (M/Z-$m_1$-$m_2$) rows of the submatrices of the first M×N parity check matrix H as a third submatrix row of the parity check matrix $H_n$;
adding m4 rows from remaining (M/Z-$m_1$-$m_2$-$m_3$) rows of the submatrices of the first M×N parity check matrix H as a fourth submatrix row of the parity check matrix $H_n$;
wherein N=1344, Z=42, $m_1$, $m_2$, $m_3$, and $m_4$ are integers, $m_1+m_2+m_3+m_4$=<M/Z, $m_1$>1 $m_2$>=1, $m_3$>=1, and $m_4$>=1.

12. The method of claim 8, wherein the first M×N parity check matrix H is a code rate 3/4 Low LDPC matrix specified in 802.11ad, wherein the first M×N parity check matrix H=168 rows×672 columns, and Z=42, and wherein the parity check matrix $H_n$ is generated with parameters $m_1$=2 and $m_2$=2, Z=42.

13. The method of claim 12, wherein the parity check matrix $H_n$ is wherein at least one submatrix has $m_1$ cyclically shifted diagonals of "1", and wherein $m_1$ is an integer>=2; and
wirelessly transmit a signal including the generated codeword vector;

wherein the parity check matrix $H_n$ is generated by
partitioning a first M×N parity check matrix H, with the lifting factor of Z, wherein M=I×Z, N=J×Z, and wherein I and J are integers, I>2 and J>0, into square submatrices of a size Z×Z, wherein the first M×N parity check matrix H contains (M/Z) rows×(N/Z) columns of the submatrices;

selecting $m_1$ rows from the M/Z rows of the submatrices of the first M×N parity check matrix H; and adding the $m_1$ rows of the submatrices of the first M×N parity check matrix H as a row of submatrices of the parity check matrix $H_n$, and $m_1$ is a integer>=2.

15. The system of claim 14, wherein the parity check matrix Hn=[$P_{(n-k)\times k}I_{(n-k)}$], where $P_{(n-k)\times k}$ is a binary matrix and $I_{(n-k)}$ is an identity matrix of order n−k; and wherein the generator matrix G is derived from the parity check matrix $H_n$ such that $GH_n^T$=0, where "T" denotes a matrix transpose.

16. The system of claim 14, wherein the system is a station, an access point, or a wireless transceiver unit.

17. A system, comprising:
a receiver configured to wirelessly receive a signal, the signal having a 1×N row vector S;
a processor, the processor configured to cause the system to:
decode the row vector S with a parity check matrix $H_n$ that is used in an encoding process; and
generate a 1×N vector $\bar{c}$=[$c_1$, ..., $c_n$] such that $Hn\bar{c}^T$=0, where "T" denotes a matrix transpose,
and wherein
the parity check matrix $H_n$ comprises a plurality of submatrices, the parity check matrix $H_n$ having a lifting factor Z, each submatrix having a size of Z×Z, wherein Z is an integer greater than 0, and wherein at least one submatrix has $m_1$ cyclically shifted diagonals of "1", and wherein $m_1$ is an integer>=2; wherein the parity check matrix $H_n$ is generated by
partitioning a first M×N parity check matrix H, with the lifting factor of Z, wherein M=I×Z, N=J×Z, and

| | | | | | | | | | | | | | — + |
|---|---|---|---|---|---|---|---|---|---|---|---|---|---|
| 37 + 35 | 31 + 19 | 18 + 41 | 23 + 22 | 11 + 40 | 21 + 41 | 6 + 39 | 20 + 6 | 32 + 28 | 9 + 18 | 12 + 17 | 29 + 3 | — + 28 | 0 + —  13 + —  — |
| 25 + 29 | 22 + 30 | 4 + 0 | 34 + 8 | 31 + 33 | 3 + 22 | 14 + 17 | 15 + 4 | 4 + 27 | — + 28 | 14 + 20 | 18 + 27 | 13 + 24 | 13 + 23  22 + —  24 + — . |

14. A system, comprising:
a processor, the processor configured to cause the system to:
receive, at a codeword generator, a 1×K source word row vector $\bar{u}$; and
generate, at the codeword generator, a 1×N codeword vector $\bar{c}=\bar{u}\cdot G$, wherein
G is a K×N generator matrix,
and wherein G is derived from a parity check matrix $H_n$, wherein the parity check matrix $H_n$ has a lifting factor Z, wherein Z is an integer greater than 0, the parity check matrix $H_n$ comprises a plurality of submatrices, each submatrix having a size Z×Z, and wherein I and J are integers, I>2 and J>0, into square submatrices of a size Z×Z, wherein the first M×N parity check matrix H contains (M/Z) rows×(N/Z) columns of the submatrices;
selecting $m_1$ rows from the M/Z rows of the submatrices of the first M×N parity check matrix H; and
adding the $m_1$ rows of the submatrices of the first M×N parity check matrix H as a row of submatrices of the parity check matrix $H_n$, and $m_1$ is a integer>=2.

18. The system of claim 17, wherein the system is a station, an access point, or a wireless transceiver unit.

* * * * *